(12) United States Patent
Yamahara et al.

(10) Patent No.: US 6,403,280 B1
(45) Date of Patent: Jun. 11, 2002

(54) RADIATION SENSITIVE RESIN COMPOSITION

(75) Inventors: Noboru Yamahara; Kiyoshi Murata; Shinichiro Iwanaga; Hiroyuki Ishii; Haruo Iwasawa, all of Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/558,067

(22) Filed: Apr. 26, 2000

(30) Foreign Application Priority Data

Apr. 28, 1999 (JP) ............................................ 11-122723

(51) Int. Cl.$^7$ .............................................. G03F 7/004
(52) U.S. Cl. ..................... 430/270.1; 430/914; 430/921
(58) Field of Search ............................. 430/270.1, 914, 430/921

(56) References Cited

U.S. PATENT DOCUMENTS

| | | | | |
|---|---|---|---|---|
| 5,843,624 A | * | 12/1998 | Houlihan et al. | ............ 430/296 |
| 6,147,249 A | * | 11/2000 | Watanabe et al. | ............ 560/120 |

FOREIGN PATENT DOCUMENTS

| | | |
|---|---|---|
| EP | 0 794 458 | 9/1997 |
| GB | 2 320 718 | 7/1998 |

OTHER PUBLICATIONS

Uetani, Y., et al., "Standard Developer Available ArF Resist and Performance", Proceedings of the SPIE—The International Society for Optical Engineering, vol. 3333, No. 1, pp. 546–553 (1998).

Lee, K.K., et al., "Maleic Anhydride Type ArF Photoresist", Polymer, vol. 39, No. 18, pp. 4457–4458 (1998).

* cited by examiner

*Primary Examiner*—Rosemary Ashton
(74) *Attorney, Agent, or Firm*—Piper Rudnick LLP; Steven B. Kelber

(57) ABSTRACT

The present invention provides a radiation sensitive resin composition which comprises (A) a resin represented by a copolymer comprising recurring units represented by the general formulae (1) or (2) as shown below, and (B) a radiation sensitive acid-generator. The radiation sensitive resin composition has an excellent storage stability and the resist produced from the composition is a chemically amplifiable type sensitive to radiations represented by fartificial ultraviolet rays. The resist has a high transparency to radiations and it is excellent in basic physical properties for resist such as durability to dry etching, sensitivity, resolution, and pattern configuration:

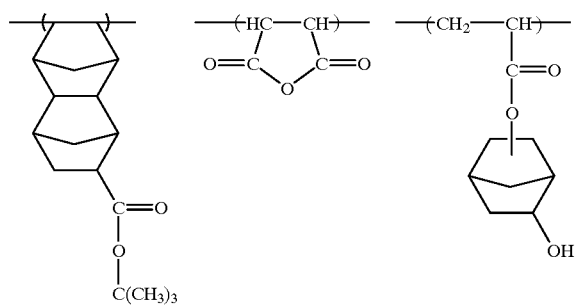

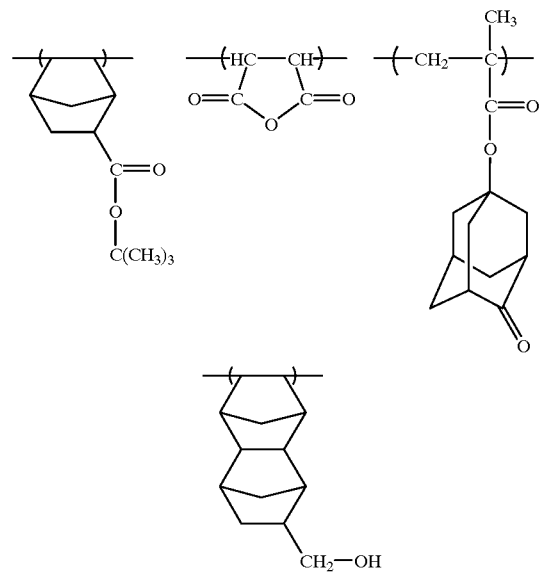

23 Claims, No Drawings

RADIATION SENSITIVE RESIN COMPOSITION

BACKGROUND OF THE INVENTION

The present invention relates to a radiation sensitive resin composition and more particularly to a radiation sensitive resin composition which can suitably be used as chemical amplification system of resist which is useful in fine processing with various radiations such as far ultraviolet radiations generated by KrF or ArF excimer lasers, X-rays of synchrotron radiations, charged corpuscular beams such as electron beams.

Recently, there has been required a lithography technique capable of processing to a fine level of 0.20 μm or less in order to achieve a higher density in the field of fine processing represented by the production of integrated circuit devices.

However, though the prior art lithography process has generally used as radiations near ultraviolet rays such as i-line, it has been said difficult to achieve fine processing to a subquater micron level by using the near ultraviolet rays.

Therefore, an attempt has been made to use of shorter wavelength radiations which make it possible to process to a fineness of 0.20 μm or less. These shorter wavelength radiations include, for example, a line spectrum of mercury lamp, far ultraviolet rays, X-rays, electron beams and the like. Among them particularly attention has been directed to KrF excimer laser (a wavelength of 248 nm) or ArF excimer laser (a wavelength of 193 nm).

As radiation sensitive resin compositions suitable for exposing with such excimer lasers, there have been proposed a number of compositions which make use of chemical amplification effects by a component having an acid labile function group and a component generating an acid (referred to as "an acid generator" hereinafter) under irradiation with radiations (referred to as "exposure" hereinafter). This type of composition is referred to as "a chemical amplification type of radiation sensitive composition" hereunder.

For example, Japanese Patent Publication Hei 2 (1990)-27660 proposes a composition containing a polymer having a t-butyl carboxylate ester group or a phenol t-butylcarbonate group and an acid generator as a chemical amplification type of radiation sensitive composition. This composition makes use of the phenomenon that the acid generated due to exposure acts to dissociate the t-butylester or the t-butylcarbonate group from the polymer so that the polymer is allowed to have an acidic group comprising a carboxyl group or a phenolic hydroxide group, which makes the exposed area of a resist film coating easily soluble in an alkaline developer solution.

Many of prior art chemical amplification type of radiation sensitive compositions are based on phenolic resins. Such phenolic resins absorb far ultraviolet radiations due to aromatic rings in the resins when far ultraviolet rays are used as radiations. Therefore, they have a drawback that the irradiated far ultraviolet rays can not sufficiently reach the bottom portion of the resist film coatings. This causes an higher amount of exposure in the upper portion and a lower amount in the lower portion of the resist film coatings. After development, the resist has a tapered profile that is thinner at upper position and thicker at lower position. Thus, there has been a problem that no sufficient resolution is achieved. Moreover, in case the resist after development has a tapered profile, the subsequent process, that is, etching and ion implantation can not be performed at a desired size accuracy, which has been also a problem. In addition, if the top configuration of the resist film coatings is other than rectangular, the resist etching rate by dry etching becomes too fast giving a problem that the etching conditions become difficult to control.

On the other hand, the accuracy of the resist pattern can be enhanced by increasing the transmittance to radiation of the resist film coatings. For example, (meth)acrylate resins as represented by polymethyl-methacrylates have a high transparency to far ultraviolet rays and are very preferable resins from the point of view of the transmittance to radiation. For example, Japanese Patent KOKAI Hei 4(1992)-226461 proposes a chemical amplification type of radiation sensitive composition using methacrylate resins. However, this composition has a drawback of a lower durability to dry etching because of having no aromatic ring, though it is excellent in the fine processing performance. In this case, it is also difficult to perform etching at a high accuracy and it can not be said that the composition has both transparency to radiations and durability to dry etching.

As an attempt to improve the durability to dry etching without impairing the transparency to radiation for the resists comprising chemical amplification type of radiation sensitive compositions, a process of introducing alicyclic groups instead of aromatic rings into a resin component in the composition has been known. For example, Japanese Patent KOKAI Hei 7(1995)-234511 describes a chemical amplification type of radiation sensitive composition using (meth)acrylate resins having alicyclic groups.

However, as acid-dissociable functional groups in the resin component, this composition contains relatively easily dissociable groups (eg. acetal functional groups of tetrahydropyranyl groups) with prior acids and less dissociable groups (eg. t-butyl functional groups of t-butylester groups, t-butylcarbonate groups and the like) the dissociation of which can be caused by acids. When the resin component has the former functional groups dissociable with acids, the basic physical properties, especially sensitivity and pattern configuration, of the resist are good, but the composition has an inferior stability during preservation. On the other hand, when the resin component has the latter functional groups dissociable with acids, in contrast, though the composition has a good stability during preservation, it has a drawback that the basic physical properties, especially sensitivity and pattern configuration, of the resist are impaired. Moreover, the incorporation of alicyclic groups into the resin component in the composition makes the resin itself extremely hydrophobic resulting in a poor adhesive property to a substrate.

Thus, there has been a need to develop a chemical amplification type of radiation sensitive resin composition having a high transparency to radiations represented by far ultraviolet rays which is not only excellent in durability to dry etching, sensitivity, resolution, pattern configuration, but also excellent in stability during preservation, and which has sufficient adhesive property to a substrate.

SUMMARY OF THE INVENTION

An object of the present invention is to provide a radiation sensitive resin composition having a high transparency to radiations which is useful for a chemical amplification type of resist sensitive to actinic rays, for example, far ultraviolet rays represented by KrF excimer laser or ArF excimer laser, which is not only excellent in basic physical properties such as durability to dry etching, sensitivity, resolution, pattern configuration, but also excellent in composition stability during preservation, and which has sufficient adhesive property to a substrate.

According to the present invention, the aforementioned object can be achieved by a radiation sensitive resin composition characterized by comprising (A) a resin containing an alkaline insoluble or less soluble group dissociable with acid, said resin being soluble in an alkaline solution when said group is dissociated with acid, selected from the group consisting of copolymers containing a recurring unit (I), a recurring unit (II) and a recurring unit (III-1) represented by the general formula (1) as shown below, and copolymers containing a recurring unit (I), a recurring unit (II) and a recurring unit (III-2) represented by the general formula (2) as shown below, and (B) a radiation sensitive acid-generator:

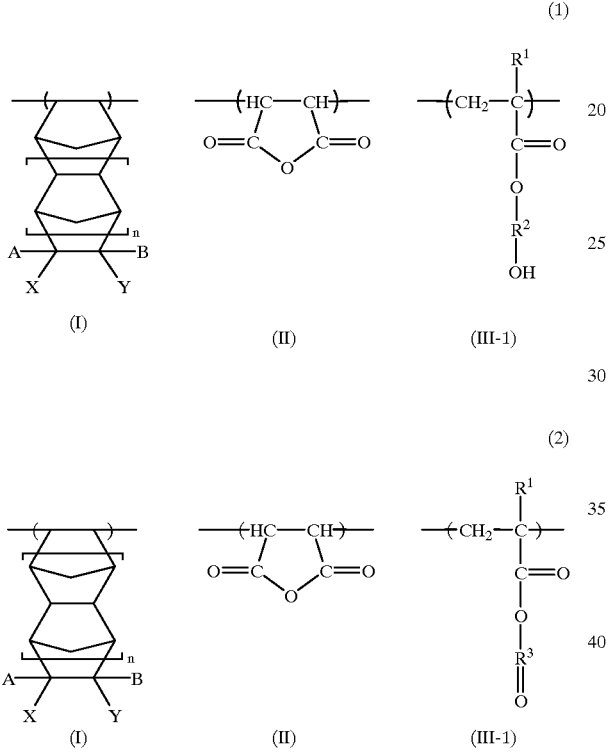

where in the general formula (1) and the general formula (2), A and B represent independently hydrogen atom, or an acid-dissociable organic group having 20 or less carbon atoms which can be dissociated in the presence of acid to produce an acidic functional group, at least one of A and B being said acid-dissociable organic group; X and Y represent independently hydrogen atom or an alkyl group having 1 to 4 carbon atoms; n is an integer of 0 to 3; $R^1$ represents hydrogen atom, methyl or methylol group; $R^2$ represents a divalent hydrocarbon group having an alicyclic group and having 3 to 15 carbon atoms; and $R^3$ represents a trivalent hydrocarbon group having an alicyclic group and having 3 to 15 carbon atoms.

DETAILED DESCRIPTION OF THE INVENTION

The present invention is described in more detail under.
(A) Components

The component (A) in the present invention is a resin (referred to as "resin (A)" hereinafter) containing an alkaline insoluble or less soluble group dissociable with acid, said resin being soluble in an alkaline solution when said group is dissociated with acid, selected from the group consisting of a copolymer containing a recurring unit (I), a recurring unit (II) and a recurring unit (III-1) represented by the general formula (1) (referred to as "copolymer (1)" hereinafter) and a copolymer containing a recurring unit (I), a recurring unit (II) and a recurring unit (III-2) represented by the general formula (2) (referred to as "copolymer (2)" hereinafter).

The inclusion of the resin (A) in the present invention can afford a radiation sensitive resin composition excellent specifically in transparency to radiation and in durability to dry etching.

Both of the copolymer (1) and the copolymer (2) comprising the resin (A). have a substituent A and(or) B, ie., an organic group having 20 or less carbon atoms which can be dissociated in the presence of acid to produce an acidic functional group (referred to as "acid-dissociable organic group (i)" hereinafter).

Preferred acid-dissociable organic group (i) includes, for example;

methoxycarbonyl, ethoxycarbonyl, n-propoxycarbonyl, i-propoxycarbonyl, n-butoxycarbonyl, 2-methylpropoxycarbonyl, 1-methylpropoxycarbonyl, t-butoxycarbonyl, n-pentyloxycarbonyl, n-hexyloxycarbonyl, n-heptyloxycarbonyl, n-octyloxycarbonyl, n-decyloxycarbonyl, (cyclo)-alkoxycarbonyl such as cyclopentyloxycarbonyl, cyclohexyloxycarbonyl, 4-t-butylcyclohexyloxycarbonyl, cycloheptyloxycarbonyl, cyclooctyloxycarbonyl, and the like;

aryloxycarbonyl such as phenoxycarbonyl, 4-t-butylphenoxycarbonyl, 1-naphthyloxycarbonyl, and the like;

aralkyloxycarbonyl such as benzyloxycarbonyl, 4-t-butylbenzyloxycarbonyl, phenethyloxycarbonyl, 4-t-butylphenethyloxycarbonyl, and the like;

1-methoxyethoxycarbonyl, 1-ethoxyethoxycarbonyl, 1-n-propoxyethoxycarbonyl, 1-i-propoxyethoxycarbonyl, 1-n-butoxyethoxycarbonyl, 1-(2'-methylpropoxy)ethoxycarbonyl, 1-(1'-methylpropoxy)-ethoxycarbonyl, 1-t-butoxyethoxycarbonyl, 1-(cyclo)alkyloxyethoxycarbonyl such as 1-cyclohexyloxyethoxycarbonyl, 1-(4'-t-butylcyclohexyloxy)ethoxycarbonyl, and the like;

1-aryloxyethoxycarbonyl such as 1-phenoxyethoxycarbonyl, 1-(4'-t-butylphenoxy)ethoxycarbonyl, 1-(1'-naphthyloxy)ethoxycarbonyl, and the like;

1-aralkyloxyethoxycarbonyl such as 1-benzyloxyethoxycarbonyl, 1-(4'-t-butylbenzyloxy)ethoxycarbonyl, 1-phenethyloxyethoxycarbonyl, 1-(4'-t-butylphenethyloxy)ethoxycarbonyl, and the like;

methoxycarbonylmethoxycarbonyl, ethoxycarbonylmethoxycarbonyl, n-propoxycarbonylmethoxycarbonyl, i-propoxycarbonylmethoxycarbonyl, n-butoxycarbonylmethoxycarbonyl, 2-methylpropoxycarbonylmethoxycarbonyl, 1-methylpropoxycarbonylmethoxycarbonyl, t-butoxycarbonylmethoxycarbonyl, (cyclo)alkoxycarbonylmethoxycarbonyl such as cyclohexyloxycarbonylmethoxycarbonyl, 4-t-butylcyclohexyl-oxycarbonylmethoxycarbonyl, and the like;

methoxycarbonylmethyl, ethoxycarbonylmethyl, n-propoxycarbonylmethyl, i-propoxycarbonylmethyl, n-butoxycarbonylmethyl, 2-methylpropoxycarbonylmethyl,
1-methylpropoxycarbonylmethyl,
t-butoxycarbonylmethyl, (cyclo)-alkoxycarbonylmethyl such as cyclohexyloxycarbonylmethyl, 4-t-butylcyclohexyloxycarbonylmethyl, and the like;
aryloxycarbonylmethyl such as phenoxycarbonylmethyl, 4-t-butylphenoxycarbonylmethyl, 1-naphthyloxycarbonylmethyl, and the like;
aralkyloxycarbonylmethyl such as benzyloxycarbonylmethyl, 4-t-butylbenzyloxycarbonylmethyl, phenethyloxycarbonylmethyl, 4-t-butylphenethyloxycarbonylmethyl, and the like;
2-methoxycarbonylethyl, 2-ethoxycarbonylethyl, 2-n-propoxycarbonylethyl, 2-i-propoxycarbonylethyl, 2-n-butoxycarbonylethyl, 2-(2'-methylpropoxy)carbonylethyl, 2-(1'-methylpropoxy)carbonylethyl, 2-t-butoxycarbonylethyl, 2-(cyclo)alkoxycarbonylethyl such as 2-cyclohexyloxycarbonyl-ethyl, 2-(4'-t-butylcyclohexyloxycarbonyl)ethyl, and the like;
2-aryloxycarbonylethyl such as 2-phenoxycarbonylethyl, 2-(4'-t-butylphenoxycarbonyl)ethyl, 2-(1'-naphthyloxycarbonyl)ethyl, and the like;
2-aralkyloxycarbonylethyl such as 2-benzyloxycarbonylethyl, 2-(4'-t-butylbenzyloxycarbonyl)ethyl, 2-phenethyloxycarbonylethyl, 2-(4'-t-butylphenethyloxycarbonyl)ethyl, and the like; and
tetrahydrofuranyloxycarbonyl, tetrahydropyranyloxycarbonyl, and the like.

Among these acid-dissociable organic group (i), a group —COOR' where R' is a (cyclo)alkyl group having 1 to 19 carbon atoms, or a group —COOCH$_2$COOR" where R" is a (cyclo)alkoxycarbonylmethyl group having 1 to 17 carbon atoms, are preferred, and 1-methylpropoxycarbonyl, t-butoxycarbonyl, t-butoxycarbonylmethoxycarbonyl are most preferred.

The alkyl group having 1 to 4 carbon atoms of X and Y in the recurring unit (I) includes, for example, methyl, ethyl, n-propyl, i-propyl, n-butyl, 2-methylpropyl, 1-methylpropyl, t-butyl and the like.

The n in the recurring unit (I) is preferably 0 or 1, and most preferably 1.

Monomers capable of giving such recurring unit (I) include, for example, norbornene derivatives (referred to as "norbornene derivatives (3)" hereinafter) represented by the following general formula (3):

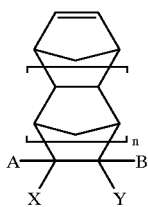

(3)

where A, B, X, Y and n are the same as those in the general formulae (1) and (2).

Embodiments of the compounds of the norbornene derivatives (3) where n in the recurring unit (I) is 0 include:
5-methoxycarbonylbicyclo[2.2.1]hept-2-ene,
5-ethoxycarbonylbicyclo[2.2.1]hept-2-ene,
5-n-propoxycarbonylbicyclo[2.2.1]hept-2-ene,
5-i-epropoxycarbonylbicyclo[2.2.1]hept-2-ene,
5-n-butoxycarbonylbicyclo[2.2.1]hept-2-ene,
5-(2'-methylpropoxy)carbonylbicyclo[2.2.1]hept-2-ene,
5-(1'-methylpropoxy)carbonylbicyclo[2.2.1]hept-2-ene,
5-t-butoxycarbonylbicyclo[2.2.1]hept-2-ene,
5-cyclohexyloxycarbonylbicyclo[2.2.1]hept-2-ene,
5-(4'-t-butylcyclohexyloxy)carbonylbicyclo[2.2.1]hept-2-ene,
5-phenoxycarbonylbicyclo[2.2.1]hept-2-ene,
5-(1'-ethoxyethoxy)carbonylbicyclo[2.2.1]hept-2-ene,
5-(1'-cyclohexyloxyethoxy)carbonylbicyclo[2.2.1]hept-2-ene,
5-t-butoxycarbonylmethoxycarbonylbicyclo[2.2.1]hept-2-ene,
5-tetrahydrofuranyloxycarbonylbicyclo[2.2.1]hept-2-ene,
5-tetrahydropyranyloxycarbonylbicyclo[2.2.1]hept-2-ene,
5-methyl-5-methoxycarbonylbicyclo[2.2.1]hept-2-ene,
5-methyl-5-ethoxycarbonylbicyclo[2.2.1]hept-2-ene,
5-methyl-5-n-propoxycarbonylbicyclo[2.2.1]hept-2-ene,
5-methyl-5-i-propoxycarbonylbicyclo[2.2.1]hept-2-ene,
5-methyl-5-n-butoxycarbonylbicyclo[2.2.1]hept-2-ene,
5-methyl-5-(2'-methylpropoxy)carbonylbicyclo[2.2.1]hept-2-ene,
5-methyl-5-(1'-methylpropoxy)carbonylbicyclo[2.2.1]hept-2-ene,
5-methyl-5-t-butoxycarbonylbicyclo[2.2.1]hept-2-ene,
5-methyl-5-cyclohexyloxycarbonylbicyclo[2.2.1]hept-2-ene,
5-methyl-5-(4'-t-butylcyclohexyloxy)carbonylbicyclo[2.2.1]hept-2-ene,
5-methyl-5-phenoxycarbonylbicyclo[2.2.1]hept-2-ene,
5-methyl-5-(1'-ethoxyethoxy)carbonylbicyclo[2.2.1]hept-2-ene,
5-methyl-5-(1'-cyclohexyloxyethoxy)carbonylbicyclo[2.2.1]hept-2-ene,
5-methyl-5-t-butoxycarbonylmethoxycarbonylbicyclo[2.2.1]hept-2-ene,
5-methyl-5-tetrahydrofuranyloxycarbonylbicyclo[2.2.1]-hept-2-ene,
5-methyl-5-tetrahydropyranyloxycarbonylbicyclo[2.2.1]-hept-2-ene,
5,6-di(methoxycarbonyl)bicyclo[2.2.1]hept-2-ene,
5,6-di(ethoxycarbonyl)bicyclo[2.2.1]hept-2-ene,
5,6-di(n-propoxycarbonyl)bicyclo[2.2.1]hept-2-ene,
5,6-di(i-propoxycarbonyl)bicyclo[2.2.1]hept-2-ene,
5,6-di(n-butoxycarbonyl)bicyclo[2.2.1]hept-2-ene,
5,6-di(2'-methylpropoxycarbonyl)bicyclo[2.2.1]hept-2-ene,
5,6-di(1'-methylpropoxycarbonyl)bicyclo[2.2.1]hept-2-ene,
5,6-di(t-butoxycarbonyl)bicyclo[2.2.1]hept-2-ene,
5,6-di(cyclohexyloxycarbonyl)bicyclo[2.2.1]hept-2-ene,
5,6-di(4'-t-butylcyclohexyloxycarbonyl)bicyclo[2.2.1]-hept-2-ene,
5,6-di(phenoxycarbonyl)bicyclo[2.2.1]hept-2-ene,
5,6-di(1'-ethoxyethoxycarbonyl)bicyclo[2.2.1]hept-2-ene,
5,6-di(1'-cyclohexyloxyethoxycarbonyl)bicyclo[2.2.1]-hept-2-ene,
5,6-di(t-butoxycarbonylmethoxycarbonyl)bicyclo[2.2.1]-hept-2-ene,
5,6-di(tetrahydrofuranyloxycarbonyl)bicyclo[2.2.1]hept-2-ene, and
5,6-di(tetrahydropyranyloxycarbonyl)bicyclo[2.2.1]hept-2-ene.

Embodiments of the compounds where n in the recurring unit (I) is 1 include:
8-methoxycarbonyltetracyclo[4.4.0.1$^{2,5}$.1$^{7,10}$]dodec-3-ene,
8-ethoxycarbonyltetracyclo[4.4.0.1$^{2,5}$.1$^{7,10}$]dodec-3-ene,
8-n-propoxycarbonyltetracyclo[4.4.0.1$^{2,5}$.1$^{7,10}$]dodec-3-ene, 8-i-propoxycarbonyltetracyclo[4.4.0.1$^{2.5}$.1$^{7.10}$]dodec-3-ene,
8-n-butoxycarbonyltetracyclo[4.4.0.1$^{2.5}$.1$^{7.10}$]dodec-3-ene,
8-(2'-methylpropoxy)carbonyltetracyclo[4.4.0.1$^{2.5}$.1$^{7.10}$]dodec-3-ene,
8-(1'-methylpropoxy)carbonyltetracyclo[4.4.0.1$^{2.5}$.1$^{7.10}$]dodec-3-ene,
8-t-butoxycarbonyltetracyclo[4.4.0.1$^{2.5}$.1$^{7.10}$]dodec-3-ene,
8-cyclohexyloxycarbonyltetracyclo[4.4.0.1$^{2.5}$.1$^{7.10}$]dodec-3-ene,
8-(4'-t-butylcyclohexyloxy)carbonyltetracyclo[4.4.0.1$^{2.5}$.1$^{7.10}$]dodec-3-ene,
8-phenoxycarbonyltetracyclo[4.4.0.1$^{2.5}$.1$^{7.10}$]dodec-3-ene,
8-(1'-ethoxyethoxy)carbonyltetracyclo[4.4.0.1$^{2.5}$.1$^{7.10}$]-dodec-3-ene,
8-(1'-cyclohexyloxyethoxy)carbonyltetracyclo[4.4.0.1$^{2.5}$.1$^{7.10}$]dodec-3-ene,
8-t-butoxycarbonylmethoxycarbonyltetracyclo[4.4.0.1$^{2.5}$.1$^{7.10}$]dodec-3-ene,
8-tetrahydrofuranyloxycarbonyltetracyclo[4.4.0.1$^{2.5}$.1$^{7.10}$]dodec-3-ene,
8-tetrahydropyranyloxycarbonyltetracyclo[4.4.0.1$^{2.5}$.1$^{7.10}$]dodec-3-ene,
8-methyl-8-methoxycarbonyltetracyclo[4.4.0.1$^{2.5}$.1$^{7.10}$]dodec-3-ene,
8-methyl-8-ethoxycarbonyltetracyclo[4.4.0.1$^{2.5}$.1$^{7.10}$]dodec-3-ene,
8-methyl-8-n-propoxycarbonyltetracyclo[4.4.0.1$^{2.5}$.1$^{7.10}$]dodec-3-ene,
8-methyl-8-i-propoxycarbonyltetracyclo[4.4.0.1$^{2.5}$.1$^{7.10}$]dodec-3-ene,
8-methyl-8-n-butoxycarbonyltetracyclo[4.4.0.1$^{2.5}$.1$^{7.10}$]dodec-3-ene,
8-methyl-8-(2'-methylpropoxy)carbonyltetracyclo[4.4.0.1$^{2.5}$.1$^{7.10}$]dodec-3-ene,
8-methyl-8-(1'-methylpropoxy)carbonyltetracyclo[4.4.0.1$^{2.5}$.1$^{7.10}$]dodec-3-ene,
8-methyl-8-t-butoxycarbonyltetracyclo[4.4.0.1$^{2.5}$.1$^{7.10}$]dodec-3-ene,
8-methyl-8-cyclohexyloxycarbonyltetracyclo[4.4.0.1$^{2.5}$.1$^{7.10}$]dodec-3-ene,
8-methyl-8-(4'-t-butylcyclohexyloxy)carbonyl-tetracyclo[4.4.0.1$^{2.5}$.1$^{7.10}$]dodec-3-ene,
8-methyl-8-phenoxycarbonyltetracyclo[4.4.0.1$^{2.5}$.1$^{7.10}$]dodec-3-ene,
8-methyl-8-(1'-ethoxyethoxy)carbonyltetracyclo[4.4.0.1$^{2.5}$.1$^{7.10}$]dodec-3-ene,
8-methyl-8-(1'-cyclohexyloxyethoxy)carbonyltetracyclo[4.4.0.1$^{2.5}$.1$^{7.10}$]dodec-3-ene,
8-methyl-8-t-butoxycarbonylmethoxycarbonyltetracyclo[4.4.0.1$^{2.5}$.1$^{7.10}$]dodec-3-ene, tetracyclo[4.4.0.1$^{2.5}$.1$^{7.10}$]dodec-3-ene,
8-methyl-8-butoxycarbonylmethoxycarbonyltetracyclo[4.4.0.1$^{2.5}$.1$^{7.10}$]dodec-3-ene,
8-methyl-8-tetrahydrofuranyloxycarbonyltetracyclo[4.4.0.1$^{2.5}$.1$^{7.10}$]dodec-3-ene,
8-methyl-8-tetrahydropyranyloxycarbonyltetracyclo[4.4.0.1$^{2.5}$.1$^{7.10}$]dodec-3-ene,
8,9-di(methoxycarbonyl)tetracyclo[4.4.0.1$^{2.5}$.1$^{7.10}$]dodec-3-ene,
8,9-di(ethoxycarbonyl)tetracyclo[4.4.0.1$^{2.5}$.1$^{7.10}$]dodec-3-ene,
8,9-di(n-propoxycarbonyl)tetracyclo[4.4.0.1$^{2.5}$.1$^{7.10}$]-dodec-3-ene,
8,9-di(i-propoxycarbonyl)tetracyclo[4.4.0.1$^{2.5}$.1$^{7.10}$]-dodec-3-ene,
8,9-di(n-butoxycarbonyl)tetracyclo[4.4.0.1$^{2.5}$.1$^{7.10}$]-dodec-3-ene,
8,9-di(2'-methylpropoxycarbonyl)tetracyclo[4.4.0.1$^{2.5}$.1$^{7.10}$]dodec-3-ene,
8,9-di(1'-methylpropoxycarbonyl)tetracyclo[4.4.0.1$^{2.5}$.1$^{7.10}$]dodec-3-ene,
8,9-di(t-butoxycarbonyl)tetracyclo[4.4.0.1$^{2.5}$.1$^{7.10}$]-dodec-3-ene,
8,9-di(cyclohexyloxycarbonyl)tetracyclo[4.4.0.1$^{2.5}$.1$^{7.10}$]dodec-3-ene,
8,9-di(4'-t-butylcyclohexyloxycarbonyl)tetracyclo[4.4.0.1$^{2.5}$.1$^{7.10}$]dodec-3-ene,
8,9-di(phenoxycarbonyl)tetracyclo[4.4.0.1$^{2.5}$.1$^{7.10}$]-dodec-3-ene,
8,9-di(1'-ethoxyethoxycarbonyl)tetracyclo[4.4.0.1$^{2.5}$.1$^{7.10}$]dodec-3-ene,
8,9-di(1'-cyclohexyloxyethoxycarbonyl)tetracyclo[4.4.0.1$^{2.5}$.1$^{7.10}$]dodec-3-ene,
8,9-di(t-butoxycarbonylmethoxycarbonyl)tetracyclo[4.4.0.1$_{2.5}$.1$^{7.10}$]dodec-3-ene,
8,9-di(tetrahydrofuranyloxycarbonyl)tetracyclo[4.4.0.1$^{2.5}$.1$^{7.10}$]dodec-3-ene, and
8,9-di(tetrahydropyranyloxycarbonyl)tetracyclo[4.4.0.1$^{2.5}$.1$^{7.10}$]dodec-3-ene.

Among these norbornene derivatives (3), 5-t-butoxycarbonylbicyclo[2.2.1]hept-2-ene, 5,6-di(t-butoxycarbonyl)bicyclo[2.2.1]hept-2-ene, 5,6-di(t-butoxycarbonyl-methoxycarbonyl)bicyclo[2.2.1]hept-2-ene, 8-t-butoxy-carbonyltetracyclo[4.4.0.1$^{2.5}$.1$^{7.10}$]dodec-3-ene, 8-methyl-8-t-butoxycarbonyltetracyclo[4.4.0.1$^{2.5}$.1$^{7.10}$]dodec-3-ene, 8-methyl-8-t-butoxycarbonylmethoxycarbonyltetracyclo[4.4.0.1$^{2.5}$.1$^{7.10}$]dodec-3-ene are preferred.

The copolymer (1) and the copolymer (2) may contain one or two or more of the recurring unit (I).

The recurring unit (II) in the general formulae (1) and (2) is derived from maleic anhydride. Maleic anhydride has a good copolymerizabilty with the norbornene derivatives (3) and allows the molecular weight of the copolymers (1) and (2) from the copolymerization of maleic anhydride and the norbornene derivatives (3) to increase to a desired level.

Next, monomers capable of giving the recurring unit (III-1) in the general formula (1) include, for example, (meth)acrylic acid derivatives represented by the following general formula (4) (referred to as "(meth)acrylic acid derivatives (4)" hereinafter):

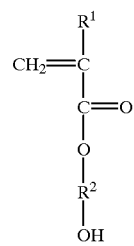

(4)

where R$^1$ and R$^2$ are the same as those in the general formula (1) above.

Embodiments of the (meth)acrylic acid derivatives (4) include compounds represented by the following general formulae (4-1) to (4-24):

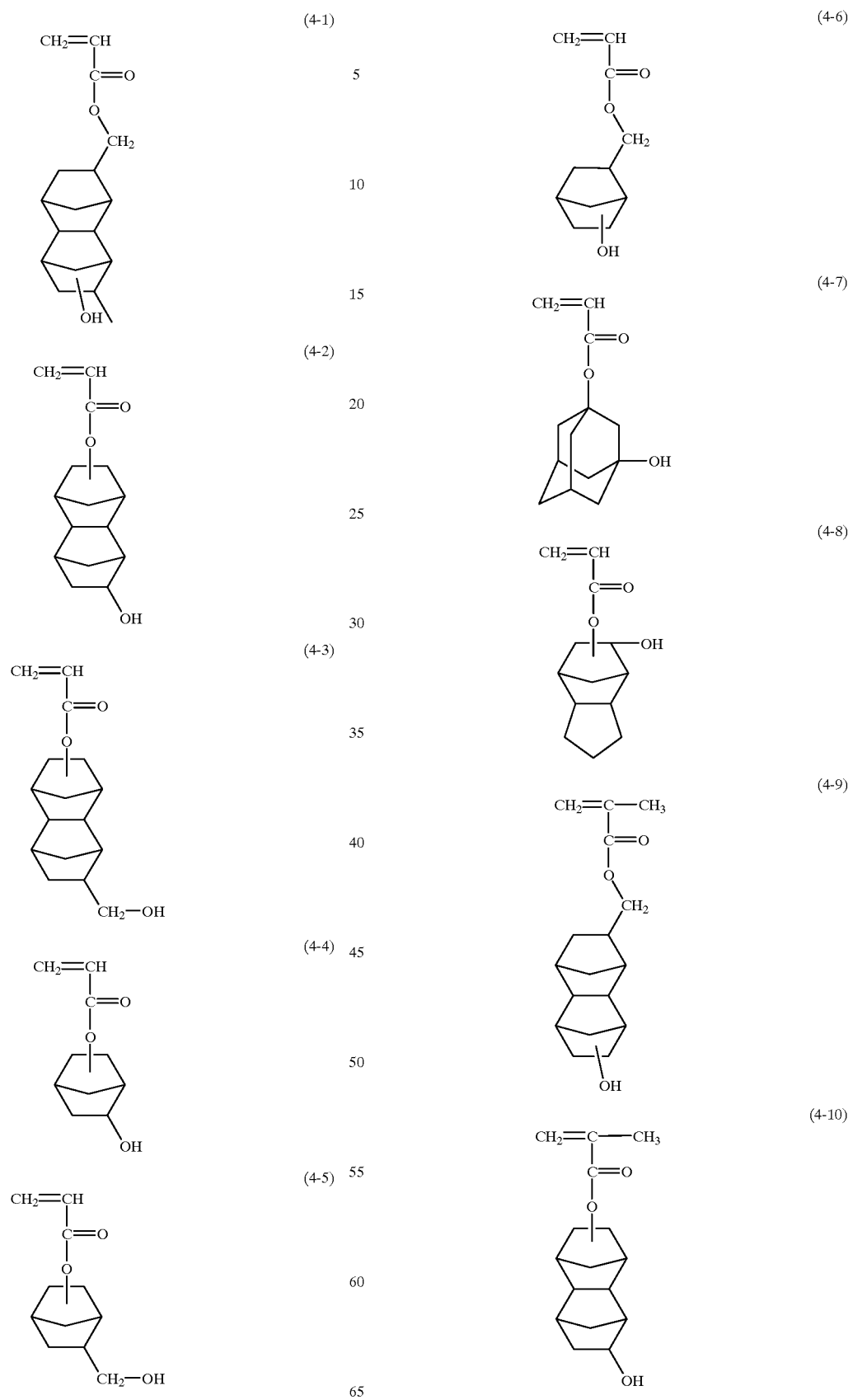

(4-11)
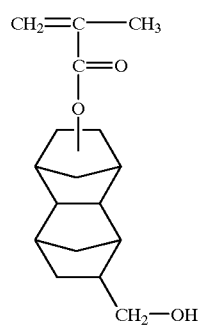
(4-12)
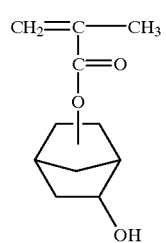
(4-13)
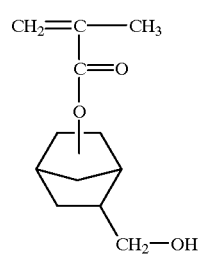
(4-14)
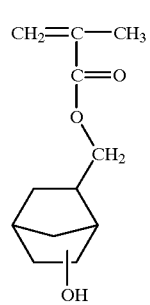
(4-15)
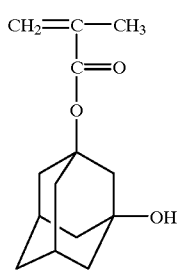
(4-16)
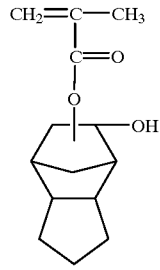
(4-17)
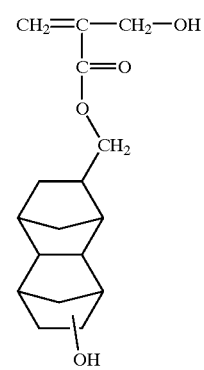
(4-18)
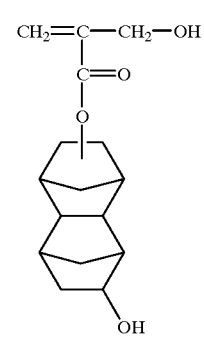
(4-19)
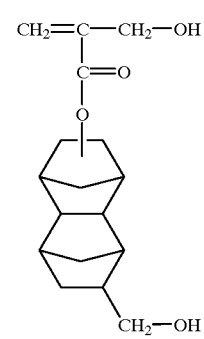
(4-20)
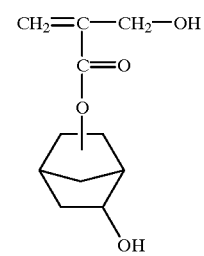

(4-21)
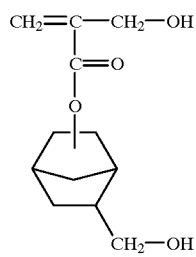

(4-22)
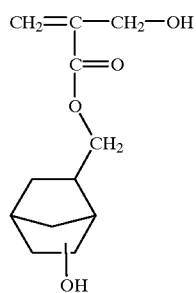

(4-23)
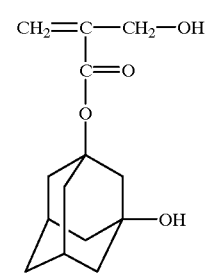

(4-24)
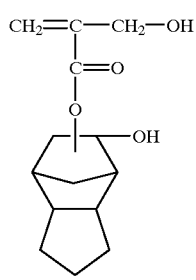

The compounds represented by the formulae (4-2), (4-4), (4-5), (4-8) or (4-15) of these (meth)acrylic acid derivatives (4) are preferred.

The copolymer (1) may contain one or two or more of the recurring unit (III-1).

Moreover, monomers capable of giving the recurring unit (III-2) in the general formula (2) include, for example, (meth)acrylic acid derivatives represented by the following general formula (5) (referred to as "(meth)acrylic acid derivatives (5)" hereinafter):

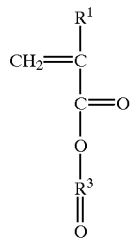
(5)

where $R^1$ and $R^3$ are the same as $R^1$ and $R^3$ in the general formula (2) above, respectively.

Embodiments of the (meth)acrylic acid derivatives (5) include compounds represented by the following general formulae (5-1) to (5-21):

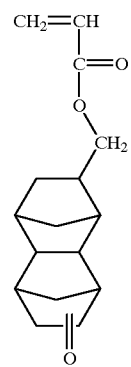
(5-1)

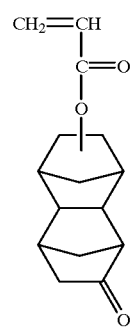
(5-2)

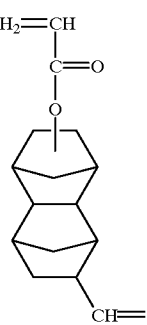
(5-3)

(5-4)
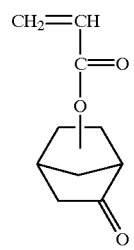
(5-5)
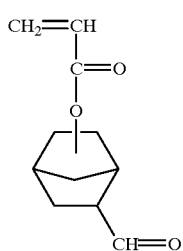
(5-6)
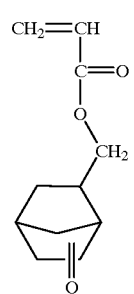
(5-7)
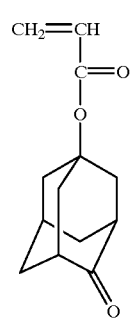
(5-8)
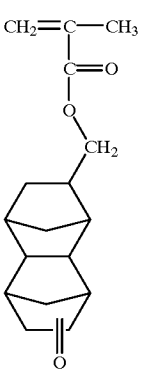
(5-9)
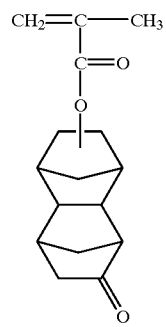
(5-10)
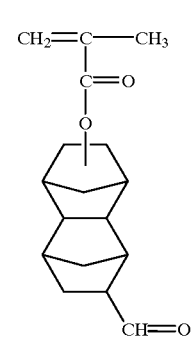
(5-11)
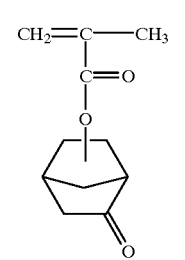
(5-12)
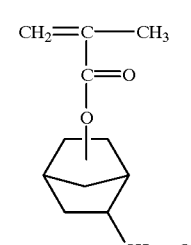
(5-13)
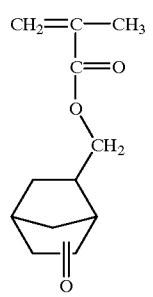

(5-14) 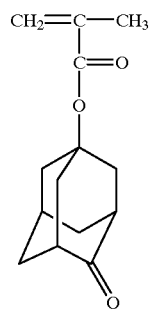

(5-15) 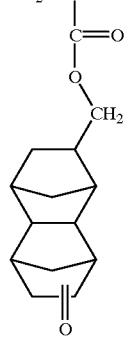

(5-16) 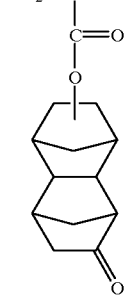

(5-17) 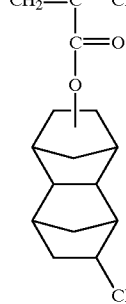

(5-18) 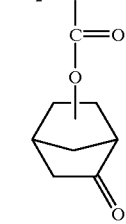

(5-19) 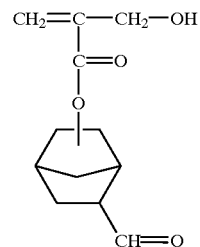

(5-20) 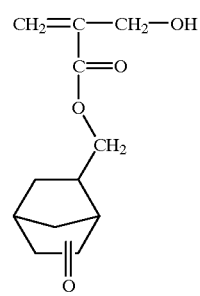

(5-21) 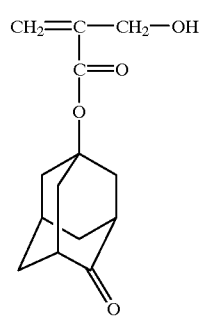

The compounds represented by the formulae (5-2), (5-4), (5-5), or (5-14) of these (meth)acrylic acid derivatives (5) are preferred.

The copolymer (2) may contain one or two or more of the recurring unit (III-2).

Moreover, the copolymer (1) and the copolymer (2) may contain one or more of a recurring unit derived from other polymeric unsaturated compounds (referred to as "other recurring unit" hereinafter).

The other recurring unit includes, for example, norbornene (i.e., bicyclo[2.2.1]hept-2-ene), recurring units that are produced from the cleavage of polymerizable carbon-carbon double bonds of norbornene derivatives containing no acid-dissociable organic group (referred to as "other norbornene derivatives (α) hereinafter) as well as recurring units that are produced from the cleavage of polymerizable carbon-carbon double bonds of other compounds having such carbon-carbon double bond (referred to as "other monomer (β)" hereinafter).

The other norbornene derivatives (α) include, for example:
5-methylbicyclo[2.2.1]hept-2-ene,
5-ethylbicyclo[2.2.1]hept-2-ene,
5-hydroxybicyclo[2.2.1]hept-2-ene,
5-hydroxymethylbicyclo[2.2.1]hept-2-ene,
bicyclo[2.2.1]hept-2-ene-5,6-carboxylic anhydride,
bicyclo[2.2.1]hept-2-ene-5,6(3H)furanone,
bicyclo[2.2.1]hept-2-ene-5,6-(3,3-dimethyl)furanone,
2-carboxy-bicyclo[2.2.1]hept-2-ene-2-yl-acetic anhydride, tetracyclo[4.4.0,1$^{2,5}$.1$^{7,10}$]dodec-3-ene,
8-methyltetracyclo[4.4.0.1$^{2,5}$.1$^{7,10}$]dodec-3-ene,
8-ethyltetracyclo[4.4.0.1$^{2,5}$.1$^{7,10}$]dodec-3-ene,
8-hydroxytetracyclo[4.4.0.1$^{2,5}$.1$^{7,10}$]dodec-3-ene,
8-hydroxymethyltetracyclo[4.4.0.1$^{2,5}$.1$^{7,10}$]dodec-3-ene,
8-fluorotetracyclo[4.4.0.1$^{2,5}$.1$^{7,10}$]dodec-3-ene,
8-fluoromethyltetracyclo[4.4.0.1$^{2,5}$.1$^{7,10}$]dodec-3-ene,
8-difluoromethyltetracyclo[4.4.0.1$^{2,5}$.1$^{7,10}$]dodec-3-ene,
8-trifluoromethyltetracyclo[4.4.0.1$^{2,5}$.1$^{7,10}$]dodec-3-ene,
8-pentafluoroethyltetracyclo[4.4.0.1$^{2,5}$.1$^{7,10}$]dodec-3-ene,
8,8-difluorotetracyclo[4.4.0.1$^{2,5}$.1$^{7,10}$]dodec-3-ene,
8,9-difluorotetracyclo[4.4.0.1$^{2,5}$.1$^{7,10}$]dodec-3-ene,
8,8-bis(trifluoromethyl)tetracyclo[4.4.0.1$^{2,5}$.1$^{7,10}$]-dodec-3-ene,
8,9-bis(trifluoromethyl)tetracyclo[4.4.0.1$^{2,5}$.1$^{7,10}$]-dodec-3-ene,
8-methyl-8-trifluoromethyltetracyclo[4.4.0.1$^{2,5}$.1$^{7,10}$]dodec-3-ene,
8,8,9-trifluorotetracyclo[4.4.0.1$^{2,5}$.1$^{7,10}$]dodec-3-ene,
8,8,9-tris(trifluoromethyl)tetracyclo[4.4.0.1$^{2,5}$.1$^{7,10}$]dodec-3-ene,
8,8,9,9-tetrafluorotetracyclo[4.4.0.1$^{2,5}$.1$^{7,10}$]dodec-3-ene,
8,8,9,9-tetrakis(trifluoromethyl)tetracyclo[4.4.0.1$^{2,5}$.1$^{7,10}$]dodec-3-ene,
8,8-difluoro-9,9-bis(trifluoromethyl)tetracyclo[4.4.0.1$^{2,5}$.1$^{7,10}$]dodec-3-ene,
8,9-difluoro-8,9-bis(trifluoromethyl)tetracyclo[4.4.0.1$^{2,5}$.1$^{7,10}$]dodec-3-ene,
8,8,9-trifluoro-9-trifluoromethyltetracyclo[4.4.0.1$^{2,5}$.1$^{7,10}$]dodec-3-ene,
8,8,9-trifluoro-9-trifluoromethoxytetracyclo[4.4.0.1$^{2,5}$.1$^{7,10}$]dodec-3-ene,
8,8,9-trifluoro-9-pentafluoropropoxytetracyclo[4.4.0.1$^{2,5}$.1$^{7,10}$]dodec-3-ene,
8-fluoro-8-pentafluoroethyl-9,9-bis(trifluoromethyl)-tetracyclo[4.4.0.1$^{2,5}$.1$^{7,10}$]dodec-3-ene,
8,9-difluoro-8-heptafluoroisopropyl-9-trifluoromethyl-tetracyclo[4.4.0.1$^{2,5}$.1$^{7,10}$]dodec-3-ene,
8-chloro-8,9,9-trifluorotetracyclo[4.4.0.1$^{2,5}$.1$^{7,10}$]-dodec-3-ene,
8,9-dichloro-8,9-bis(trifluoromethyl)tetracyclo[4.4.0.1$^{2,5}$.1$^{7,10}$]dodec-3-ene,
8-(2',2',2'-trifluorocarboethoxy)tetracyclo[4.4.0.1$^{2,5}$.1$^{7,10}$]dodec-3-ene,
8-methyl-8-(2',2',2'-trifluorocarboethoxy)tetracyclo[4.4.0.1$^{2,5}$.1$^{7,10}$]dodec-3-ene,
dicyclopentadiene, tricyclo[5.2.1.0$^{2,6}$]dec-8-ene, tricyclo[5.2.1.0$^{2,6}$]dec-3-ene, tricyclo[4.4.0.1$^{2,5}$]undec-3-ene, tricyclo[6.2.1.0$^{1,8}$]undec-9-ene, tricyclo[6.2.1.0$^{1,8}$]-undec-4-ene, tetracyclo[4.4.0.1$^{2,6}$.1$^{7,10}$.0$^{1,6}$]dodec-3-ene,
8-methyltetracyclo[4.4.0.1$^{2,5}$.1$^{7,10}$.0$^{1,6}$]dodec-3-ene,
8-ethylidenetetracyclo[4.4.0.1$^{2,5}$.1$^{7,12}$]dodec-3-ene,
8-ethylidenetetracyclo[4.4.0.1$^{2,5}$.1$^{7,10}$.0$^{1,6}$]dodec-3-ene,
pentacyclo[6.5.1.1$^{3,6}$.0$^{2,7}$.0$^{9,13}$]pentadec-4-ene, and pentacyclo[7.4.0.1$^{2,5}$.1$^{9,12}$.0$^{8,13}$]pentadec-3-ene.

The other monomers (β) include, for example:
(meth)acrylate esters such as norbornyl (meth)acrylate, isobornyl (meth)acrylate, tricyclodecanyl (meth) acrylate, tetracyclodecanyl (meth)acrylate, dicyclopentenyl (meth)-acrylate, adamantyl (meth)acrylate, adamantyl methyl (meth)-acrylate, 1-methyladamantyl (meth)acrylate, methyl (meth)-acrylate, ethyl (meth) acrylate, n-propyl (meth)acrylate, n-butyl (meth) acrylate, 2-hydroxyethyl (meth)acrylate, 2-hydroxypropyl (meth)acrylate, 3-hydroxypropyl (meth)-acrylate, cyclopropyl (meth)acrylate, cyclopentyl (meth)-acrylate, cyclohexyl (meth)acrylate, cyclohexenyl (meth)-acrylate, 4-methoxycyclohexyl (meth) acrylate, 2-cyclopropyloxycarbonylethyl (meth) acrylate, 2-cyclopentyloxycarbonylethyl (meth) acrylate, 2-cyclohexyloxycarbonylethyl (meth) acrylate, 2-cyclohexenyloxycarbonylethyl (meth)-acrylate, 2-(4'-methoxycyclohexyl)oxycarbonylethyl (meth)acrylate, and the like;

α-hydroxymethylacrylate esters such as methyl α-hydroxymethylacrylate, ethyl α-hydroxymethylacrylate, n-propyl α-hydroxymethylacrylate, n-butyl α-hydroxymethyl-acrylate, and the like;

vinyl esters such as vinyl acetate, vinyl propionate, vinyl butyrate, and the like;

unsaturated nitrile compounds such as (meth) acrylonitrile, α-chloroacrylonitrile, croton nitrile, malein nitrile, fumaronitrile, mesacon nitrile, citracon nitrile, itacon nitrile, and the like;

unsaturated amide compounds such as (meth)acrylamide, N,N-dimethyl(meth)acrylamide, crotonamide, maleinamide, fumaramide, mesaconamide, citraconamide, itaconamide, and the like;

other nitrogen-containing vinyl compounds such as N-vinyl-ε-caprolactam, N-vinylpyrrolidone, vinylpyridine, vinylimidazole, and the like;

unsaturated carboxylic acids (anhydrides) such as (meth) acrylic acid, crotonic acid, maleic acid, maleic anhydride, fumaric acid, itaconic acid, citraconic acid, mesaconic acid, and the like;

carboxyl group containing esters of unsaturated carboxylic acids such as 2-carboxyethyl (meth)acrylate, 2-carboxypropyl (meth)acrylate, 3-carboxypropyl (meth)-acrylate, 4-carboxybutyl (meth)acrylate, 4-carboxycyclohexyl (meth)acrylate, carboxytricyclodecanyl (meth)acrylate, carboxytetracyclodecanyl (meth)acrylate, and the like.

monofunctional monomers such as compounds produced by substituting the hydrogen atoms in carboxyl groups of said unsaturated carboxylic acids or said carboxyl group containing esters of said unsaturated carboxylic acids with acid-dissociable organic group (referred to as "acid-dissociable organic group (ii)" hereinafter) as described below;

multifunctional monomers such as methylene glycol di(meth)acrylate, ethylene glycol di(meth)acrylate, propylene glycol di(meth)acrylate, 1.6-hxanediol di(meth)-acrylate, 2.5-dimethyl-2.5-hxanediol di(meth)acrylate, 1,8-octanediol di(meth)acrylate, 1,9-nonanediol di(meth)-acrylate, 1,4-bis(2-hydroxypropyl)benzene di(meth)acrylate, 1.3-bis(2-hydroxypropyl)benzene di(meth)acrylate, 1,2-adamantane diol di(meth)acrylate, 1.3-adamantane diol di(meth)acrylate, 1,4-adamantane diol di(meth) acrylate, tricyclodecanyldimethylol di(meth)acrylate, and the like.

Acid-dissociable organic groups (ii) include, for example, substituted methyl groups, 1-substituted ethyl groups, 1-branched alkyl groups, silyl group, germyl group, alkoxycarboxyl groups, acyl group, cyclic acid-dissociable groups [except those where the compounds produced by substituting the hydrogen atoms of carboxyl groups in (meth)acrylic acids with said cyclic acid-dissociable group are equivalent to (meth)acrylic acid (4) and (meth)acrylic acid derivatives (5)].

Substituted methyl groups as described above include, for example, methoxymethyl, methylthiomethyl, ethoxymethyl, ethylthiomethyl, methoxyethoxymethyl, benzyl-oxymethyl, benzylthiomethyl, phenacyl, bromophenacyl, methoxyphenacyl, methylthiophenacyl, α-methylphenacyl, cyclopropylmethyl, benzyl, diphenylmethyl, triphenylmethyl, bromobenzyl, nitrobenzyl, methoxybenzyl, methylthiobenzyl, ethoxybenzyl, ethylthiobenzyl, piperonyl, methoxycarboxyl-methyl, ethoxycarboxylmethyl, n-propoxycarboxylmethyl, isopropoxycarboxylmethyl, n-butoxycarboxylmethyl, t-butoxy-carboxylmethyl, and the like.

1-substituted ethyl groups as described above include, for example, 1-methoxyethyl, 1-methylthioethyl, 1,1-dimethoxyethyl, 1-ethoxyethyl, 1-ethylthioethyl, 1,1-diethoxyethyl, 1-phenoxyethyl, 1-phenylthioethyl, 1,1-diphenoxyethyl, 1-benzyloxyethyl, 1-benzylthioethyl, 1-cyclopropylethyl, 1-phenylethyl, 1,1-diphenylethyl, 1-methoxycarbonylethyl, 1-ethoxycarbonylethyl, 1-n-propoxycarbonylethyl, 1-isopropoxycarbonylethyl, 1-n-butoxycarbonylethyl, 1-t-butoxycarbonylethyl, and the like.

1-branched alkyl groups as described above include, for example, isopropyl, sec-butyl, t-butyl, 1,1-dimethylpropyl, 1-methylbutyl, 1,1-dimethylbutyl, and the like.

Silyl groups as described above include, for example, trimethylsilyl, ethyldimethylsilyl, methyldiethyl-silyl, triethylsilyl, isopropyldimethylsilyl, methyl-diisopropylsilyl, triisopropylsilyl, t-butyldimethylsilyl, methyldi-t-butylsilyl, tri-t-butylsilyl, phenyldimethyl-silyl, methyldiphenylsilyl, triphenylsilyl, and the like.

Germyl groups as described above include, for example, trimethylgermyl, ethyldimethylgermyl, methyldiethylgermyl, triethylgermyl, isopropyldimethylgermyl, methyldiisopropylgermyl, triisopropylgermyl, t-butyldimethylgermyl, methyldi-t-butylgermyl, tri-t-butylgermyl, phenyldimethylgermyl, methyldiphenylgermyl, triphenylgermyl, and the like.

Alkoxycarbonyl groups as described above include, for example, methoxycarbonyl, ethoxycarbonyl, isopropoxy-carbonyl, t-butoxycarbonyl, and the like.

Acyl groups as described above include, for example, acetyl, propionyl, butyryl, heptanoyl, hexanoyl, valeryl, pivaloyl, isovaleryl, lauroyl, myristoyl, palmitoyl, stearoyl, oxalyl, maronyl, succinyl, glutaryl, adipoyl, piperoyl, suberoyl, azelaoyl, sebacoyl, acryloyl, propioloyl, methacryloyl, crotonoyl, oleoyl, maleoyl, fumaroyl, mesaconoyl, canphoroyl, benzoyl, phthaloyl, isophthaloyl, terephthaloyl, naphthoyl, toluoyl, hydro-atropoyl, atropoyl, cinnamoyl, furoyl, thenoyl, nicotinoyl, isonicotinoyl, p-toluenesulfonyl, mesyl, and the like.

Moreover, cyclic acid-dissociable groups include, for example, 3-oxocyclohexyl, tetrahydropyranyl, tetrahydro-furanyl, tetrahydrothiopyranyl, tetrahydrothiofuranyl, 3-bromotetrahydropyranyl, 4-methoxytetrahydropyranyl, 2-oxo-4-methyl-4-tetrahydropyranyl, 4-methoxytetrahydrothiopyranyl, 3-tetrahydrothiophene-1, 1-dioxide, and the like.

The copolymer (1) and the copolymer (2) have usually a content of the total of the recurring unit (I) and the recurring units derived from norbornene and other norbornene derivatives (α) of 20 to 95 molar %, preferably 30 to 80, more preferably 35 to 80 molar % based on the whole recurring units, and usually a content of the recurring unit (II) of 5 to 85 molar %, preferably 10 to 50 molar %, more preferably 10 to 45 molar % based on the whole recurring units, and usually a content of the recurring unit (III-1) or the recurring unit (III-2) of 5 to 75 molar %, preferably 10 to 50 molar %, more preferably 10 to 45 molar % based on the whole recurring units, and usually a content of the recurring units derived from other monomers (β) of 10 molar % or less, preferably 8 molar % or less, more preferably 5 molar % or less based on the whole recurring units.

In this case, if the content of the total of the recurring unit (I) and the recurring units derived from norbornene and other norbornene derivatives (α) is less than 20 molar %, the resist tends to have a reduced durability to dry etching. On the other hand, if it is over 95 molar %, the resist tends to have lower developability and lower adhesive property to substrate. If the content of the recurring unit (II) is less than 5 molar %, the resist tends to have lower adhesive property to substrate, while if it is over 85 molar %, the resist tends to have a reduced durability to dry etching. If the content of the recurring unit (III-1) or the recurring unit (III-2) is less than 5 molar %, the resist tends to have lower developability, while if it is over 75 molar %, the resist tends to have a reduced resolution and lower durability to heat.

Moreover, the content of the recurring unit (I) relative to the total of the recurring unit (I) and the recurring units derived from norbornene and other norbornene derivatives (α) is usually 20 to 100 molar %, preferably 40 to 100, more preferably 50 to 100 molar %. In this case, if the content of the recurring unit (I) is less than 20 molar %, the resist tends to have lower developability.

The copolymer (1) and the copolymer (2) may be produced, for example, by copolymerizing norbornene derivatives (3) and maleic anhydride and (meth)acrylic acid derivatives (4) or (meth)acrylic acid derivatives (5), optionally with other polymerizable unsaturated compounds, unsing a radical polymerization initiator such as hydroperoxides, dialkylperoxides, diacylperoxides, and azo compounds, in an appropriate solvent.

The solvents which may be used in the aforementioned copolymerization include, for example, alkanes such as n-pentane, n-hexane, n-heptane, n-octane, n-nonane, n-decane; cycloalkanes such as cyclohexane, cycloheptane, cyclooctane, decalin, norbornane; aromatic hydrocarbons such as benzene, toluene, xylene, ethylbenzene, cumene; halogenide hydrocarbons such as chlorobutanes, bromohexanes, dichloroethanes, hexamethylene dibromide, chlorobenzene; saturated carboxylic acid esters such as ethyl acetate, n-butyl acetate, i-butyl acetate, methyl propionate; ethers such as tetrahydrofuran, dimethoxyethane, diethoxy-ethane.

These solvents may be used alone or in a combination of two or more. The reaction temperature of said copolymerization is usually in the range of 40 to 120° C., preferably 50 to 90° C., and the reaction time is usually 1 to 48 hours, preferably 1 to 24 hours.

Gel permeation chromatography (GPC) analysis indicates that the copolymer (1) and the copolymer (2) have usually a weight average molecular weight measured as polystyrene (referred to as "Mw" hereinafter) of 3,000 to 300,000, preferably 4,000 to 200,000, more preferably 5,000 to 100,000. In this case, if the copolymer (1) and the copolymer (2) have a Mw of less than 3,000, the resist tends to have lower heat-resistance, while if they have a Mw of higher than 300,000, the resist tends to have lower developability.

The copolymer (1) and the copolymer (2) are more preferable as the content of impurities such as metals is lowered, so that the resist may be further improved in sensitivity, resolution, process stability, pattern configuration. Methods for purification of the copolymer (1) and the copolymer (2) include, for example, chemical purification such as washing with water and liquid to liquid extraction, or a combination of the chemical purification and a physical purification such as ultra-filtration and centrifugation.

The copolymer (1) and the copolymer (2) may be used alone or in a combination of two or more thereof, or both the copolymer (1) and the copolymer (2) may be used in the present invention.

(B) Components

Next, the component (B) of the present invention comprises a radiation sensitive acid generator which can generate acid under exposure (referred to as acid generator" hereinafter).

The acid generator (B) has a function of dissociating the acid-dissociable organic group present in the resin (A) due to the function of acid generated under exposure, so that the resist becomes easily soluble in an alkaline developing solution in the exposed area to form a positive type of resist pattern.

Such an acid generator (B) includes, for example, onium salt, halogen containing compounds, diazoketone, sulfone compounds, and sulfonic acid compounds.

Exemplary acid generator (B) includes the followings:

Onium Salts

For example, iodonium salts, sulfonium salts (including tetrahydrothiophenium salts), phosphonium salts, diazonium salts, and pyridinium salts may be mentioned as onium salts.

Preferred embodiments of onium salts include:
diphenyliodoniumtrifloromethanesulfonate, diphenyliodoniumnonafloro-n-butanesulfonate, diphenyliodoniumpyrenesulfonate, diphenyliodonium n-dodecylbenzenesulfonate, diphenyliodoniumhexafloroantimonate, bis(4-t-butylphenyl)iodoniumtrifloromethanesulfonate, bis(4-t-butylphenyl)iodoniumnonafloro-n-butanesulfonate, bis(4-t-butylphenyl)iodonium n-dodecylbenzenesulfonate, bis(4-t-butylphenyl)-iodoniumhexafloroantimonate, bis(4-t-butylphenyl)-iodoniumnaphthalenesulfonate, triphenylsulfoniumtrifloromethanesulfonate, triphenylsulfoniumnonafloro-n-butanesulfonate, triphenylsulfoniumhexafloroantimonate, triphenylsulfonium-naphthalenesulfonate, triphenylsulfonium-10-camphorsulfonate, 4-hydroxyphenylphenyl-methylsulfonium p-toluenesulfonate, cyclohexyl-2-oxocyclohexyl-methylsulfoniumtrifloromethane-sulfonate, dicyclohexyl-2-oxocyclohexylsulfoniumtrifloromethanesulfonate, 2-oxocyclohexyldimethylsulfoniumtrifloromethanesulfonate, 4-hydroxyphenyl-benzyl-methylsulfonium p-toluenesulfonate, 1-naphthyldimethylsulfoniumtrifloro-methanesulfonate, 1-naphthyldiethylsulfoniumtrifloro-methanesulfonate, 4-cyano-1-naphthyldimethylsulfoniumtrifloromethanesulfonate, 4-nitro-1-naphthyldimethylsulfoniumtrifloromethanesulfonate, 4-methyl-1-naphthyldimethylsulfoniumtrifloromethanesulfonate, 4-cyano-1-naphthyldiethylsulfoniumtrifloromethanesulfonate, 4-nitro-1-naphthyldiethylsulfoniumtrifloromethanesulfonate, 4-methyl-1-naphthyldiethylsulfoniumtrifloromethanesulfonate, 4-hydroxy-1-naphthyldimethylsulfoniumtrifloromethanesulfonate, 4-hydroxy-1-naphthyltetrahydrothiophenium-trifloromethanesulfonate, 4-methoxy-1-naphthyltetrahydrothiophenium-trifloromethanesulfonate, 4-ethoxy-1-naphthyltetrahydro-thiopheniumtrifloromethanesulfonate, 4-n-butoxy-1-naphthyl-tetrahydrothiopheniumnonafloro-n-butanesulfonate, 4-methoxy-methoxy-1-naphthyltetrahydrothiopheniumtrifloromethane-sulfonate, 4-ethoxymethoxy-1-naphthyltetrahydrothiophenium-trifloromethanesulfonate, 4-(1'-methoxyethoxy)-1-naphthyltetrahydrothiopheniumtrifloro-methanesulfonate, 4-(2'-methoxyethoxy)-1-naphthyltetrahydrothiopheniumtrifloro-methanesulfonate, 4-methoxycarbonyloxy-1-naphthyltetrahydrothiopheniumtrifloromethane-sulfonate, 4-ethoxycarbonyloxy-1-naphthyltetrahydrothio-pheniumtrifloromethanesulfonate, 4-n-propoxycarbonyloxy-1-naphthyltetrahydrothiophenium-trifloromethanesulfonate, 4-i-propoxycarbonyloxy-1-naphthyl-tetrahydrothiopheniumtrifloromethanesulfonate, 4-n-butoxy-carbonyloxy-1-naphthyltetrahydrothiophenium-trifloromethanesulfonate, 4-t-butoxycarbonyloxy-1-naphthyltetrahydro-thiopheniumtrifloromethanesulfonate, 4-(2'-tetrahydro-furanyloxy)-1-naphthyltetrahydrothiophenium-trifloromethanesulfonate, 4-(2'-tetrahydropyranyloxy)-1-naphthyltetrahydrothiopheniumtrifloromethane-sulfonate, 4-benzyloxy-1-naphthyl-tetrahydrothiopheniumtrifloromethanesulfonate, and 1-(1'-naphthylacetomethyl) tetrahydrothiopheniumtrifloromethanesulfonate.

Halogen Containing Compounds

For example, haloalkyl group containing hydrocarbon compounds and haloalkyl group containing heterocyclic compounds can be mentioned as halogen containing compounds.

Preferred embodiments of halogen containing compounds include (trichloromethyl)-s-triazine derivatives such as phenylbis(trichloromethyl)-s-triazine, 4-methoxy-phenylbis (trichloromethyl)-s-triazine, and 1-naphthylbis-(trichloromethyl)-s-triazine; 1,1-bis(4'-chlorophenyl)-2,2,2-trichloroethane and the like.

Diazoketone Compounds

For example, 1,3-diketo-2-diazo compounds, diazobenzoquinone compounds and diazonaphthoquinone compounds may be mentioned as diazoketone compounds.

Preferred embodiments of diazoketones include 1,2-naphthoquinonediazido-4-sulfonylchloride, 1,2-naphtho-quinonediazido-5-sulfonylchloride; 1,2-naphthoquinone-diazido-4-sulfonic acid ester or 1,2-naphthoquinonediazido-5-sulfonic acid ester of 2,3,4,4'-tetrahydroxybenzophenone; and 1,2-naphthoquinonediazido-4-sulfonic acid ester or 1,2-naphthoquinonediazido-5-sulfonic acid ester of 1,1,1-tris-(4'-hydroxyphenyl)ethane.

Sulfone Compounds

For example, β-ketosulfone, β-sulfonyl-sulfone, α-diazo compounds of those compounds and the like may be mentioned as sulfone compounds.

As preferred embodiments of sulfone compounds, 4-trisphenacylsulfone, mesitylphenacylsulfone, and bis (phenylsulfonyl)methane may be mentioned.

Sulfonic Acid Compounds

For example, alkyl sulfonate esters, alkyl sulfonic acid imides, haloalkyl sulfonate esters, aryl sulfonate esters, and iminosulfonates may be mentioned as sulfonic acid compounds.

Preferred embodiments of sulfonic acid compounds include benzoin tosylate, pyrogallol tris (trifloromethanesulfonate), nitrobenzyl-9,10-diethoxyanthracene-2-sulfonate, trifloromethanesulfonylbicyclo[2.2.1]hept-5-ene-2,3-dicarbodiimide, N-hydroxysuccinimidetrifloromethanesulfonate, and 1,8-naphthalenedicarboxylic acid imide trifloromethanesulfonate.

Especially preferred acid generators (B) of them include diphenyliodoniumtrifloromethanesulfonate, bis(4-t-butylphenyl)iodoniumtrifloromethanesulfonate, bis(4-t-butylphenyl)iodoniumnonafloro-n-butanesulfonate, triphenylsulfoniumtrifloromethanesulfonate, triphenylsulfoniumnonafloro-n-butanesulfonate, cyclohexyl 2-oxocyclohexyl methylsulfoniumtrifloromethanesulfonate, dicyclohexyl 2-oxocyclohexylsulfoniumtrifloromethanesulfonate, 2-oxocyclohexyldimethylsulfoniumtrifloromethanesulfonate, 4-hydroxy-1-naphthyldimethylsulfoniumtrifloromethanesulfonate, 4-hydroxy-1-naphthyltetrahydrothiophniumtrifloromethanesulfonate, 1-(1-naphthylacetomethyl)-tetrahydrothiophniumtrifloromethanesulfonate, trifloromethanesulfonylbicyclo[2.2.1]hept-5-ene-2,3-dicarbodiimide, N-hydroxysuccinimidetrifloromethanesulfonate, and 1,8-naphthalene dicarboxylic acid imide trifloromethanesulfonate.

The acid generators (B) may be used alone or a combination of two or more thereof in the present invention.

The amount of the acid generators (B) to be used is usually 0.1 to 10 parts by weight, preferably 0.5 to 7 parts by weight based on 100 parts by weight of the resin (A) from the point of view of ensuring that the resist has a sufficient sensitivity and developability. In this case, if the amount of the acid generators (B) to be used is less than 0.1 parts by weight, the sensitivity and the developability tends to be lowered, while if it is over 10 parts by weight, the transparency tends to be reduced making it difficult to achieve a rectangular pattern of resist.

Various Additives

In the radiation sensitive resin composition of the present invention, there should preferably be incorporated an acid diffusion controlling agent which has a function of controlling the diffusion phenomenon through the resist film of the acids produced from the acid generators (B) under exposure, thereby controlling undesired chemical reactions in the non-exposed area.

The incorporation of such acid diffusion controlling agents can improve further the storage stability of the resulting radiation sensitive resin composition as well as the resolution of resist. Moreover, it can suppress the line width fluctuation of resist pattern owing to the variation of transition time from the exposure to the development treatment (PED) to provide a composition extremely excellent in process stability.

As acid diffusion controlling agents, a nitrogen-containing organic compound the basicity of which does not change with the exposure or heat-treatment during the resist pattern forming process is preferred.

The nitrogen-containing organic compound as above includes, for example, a compound represented by the following general formula (6):

(6)

where $R^4$, $R^5$ and $R^6$ represent independently hydrogen atom, substituted or unsubstituted alkyl group, substituted or unsubstituted aryl group, or substituted or unsubstituted aralkyl group, (referred to as "nitrogen-containing compound (i)" hereinafter), a compound having two of nitrogen atoms in the same molecule (referred to as "nitrogen-containing compound (ii)" hereinafter), a compound having three or more of nitrogen atoms in the same molecule (referred to as "nitrogen-containing compound (iii)" hereinafter), an amide-containing compound, a urea containing compound, and a nitrogen-containing heterocyclic compound.

The nitrogen-containing compound (i) includes, for example, n-hexylamine, n-heptylamine, n-octylamine, n-nonyl-amine, n-decylamine, mono(cyclo)alkylamines such as cyclohexylamine; di-n-butylamine, di-n-pentylamine, di-n-hexylamine, di-n-heptylamine, di-n-octylamine, di-n-nonyl-amine, di-n-decylamine, di(cyclo)alkylamines such as cyclohexylmethylamine, dicyclohexylamine; triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, tri(cyclo)alkylamines such as cycloheptyldimethylamine, dicyclohexylmethylamine, tricyclo-hexylamine; aromatic amines such as aniline, N-methyl-aniline, N,N-dimethylaniline, 2-methylaniline, 3-methyl-aniline, 4-methylaniline, 4-nitroaniline, diphenylamine, triphenylamine, and naphthylamine.

The nitrogen-containing compound (ii) includes, for example, ethylenediamine, N,N,N',N'-tetramethylethylene-diamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, 2,2-bis(4'-aminophenyl)propane, 2-(3'-aminophenyl)-2-(4'-aminophenyl)-propane, 2-(4'-aminophenyl)-2-(3'-hydroxyphenyl)propane, 2-(4'-aminophenyl)-2-(4'-hydroxyphenyl)propane, 1,4-bis[1'-(4"-aminophenyl)-1'-methylethyl]benzene, 1,3-bis[1'-(4"-aminophenyl)-1'-methylethyl]benzene.

As the nitrogen-containing compound (iii), for example, polymers such as polyethylene imine, polyallylamine, and 2-dimethylaminoethylacrylamide may be mentioned.

The nitrogen-containing compounds as above include, for example, formamide, N-methylformamide, N,N-dimethylformamide, acetoamide, N-methylacetamide, N,N-dimethylacetamide, propionamide, benzamide, pyrrolidone, and N-methylpyrrolidone.

The urea compounds as described above include, for example, urea, methylurea, 1,1-dimethylurea, 1,3-dimethyl-urea, 1,1,3,3-tetramethylurea, 1,3-diphenylurea, tri-n-butylurea.

The nitrogen-containing heterocyclic compounds as described above include, for example, imidazoles such as imidazole, benzimidazole, 4-methylimidazole, and 4-methyl-2-phenylimidazole; pyridines such as pyridine, 2-methyl-pyridine, 4-methylpyridine, 2-ethylpyridine, 4-ethyl-pyridine, 2-phenylpyridine, 4-phenylpyridine, 2-methyl-4-phenylpyridine, nicotine, nicotine acid, nicotine acid amide, quinoline, 4-hydroxyquinoline, 8-oxyquinoline, and acridine; piperazines such as piperazine, and 1-(2'-hydroxy-ethyl)piperazine; pyrazine, pyrazole, pyridazine, quinizarin, purine, pyrrolidine, piperidine, morpholine, 4-methylmorpholine, 1,4-dimethylpiperadine, and 1,4-diaza-bicyclo[2.2.2]octane.

Among these nitrogen-containing organic compounds, the nitrogen-containing compound (i) and the nitrogen-containing heterocyclic compound are preferred. Especially tri(cyclo)alkylamines of the nitrogen-containing compounds are preferred, and pyridines and piperazines of the nitrogen-containing heterocyclic compounds are specifically preferred.

The aforementioned acid diffusion controlling agents may be used alone or in a mixture of two or more thereof.

The amount of the acid diffusion controlling agent to be incorporated is normally not higher than 15 parts by weight, preferably not higher than 10 parts by weight, more preferably 5 parts by weight or less based on 100.parts by weight of the resin (A). In this case, if the amount of the acid diffusion controlling agent to be incorporated is above 15 parts by weight, the resist tends to have lower sensitivity and lower developability in exposed portions. If it is less than 0.01 parts by weight, the pattern configuration and the dimension accuracy of the resist may be possibly reduced depending upon process conditions.

Moreover, in the radiation sensitive resin composition of the present invention there may be incorporated an alicyclic additive having an acid-dissociable organic group which serves to improve the durability to dry etching, the pattern configuration, and the adhesiveness.

The alicyclic adhesive includes, for example:
adamantane derivatives such as t-butyl 1-adamantane carboxylate, t-butyl 3-adamantane carboxylate, di-t-butyl 1,3-adamantane dicarboxylate, t-butyl 1-adamantane acetate, t-butyl 3-adamantane acetate, and di-t-butyl 1,3-adamantane diacetate;
deoxycholic acid esters such as t-butyl deoxycholate, t-butoxycarbonylmethyl deoxycholate, 2-ethoxyethyl deoxycholate, 2-cyclohexyloxyethyl deoxycholate, 3-oxocyclo-hexyl deoxycholate, tetrahydropyranyl deoxycholate, and mevalonolactone deoxycholic acid ester; and
lithocholic acid esters such as t-butyl lithocholate, t-butoxycarbonylmethyl lithocholate, 2-ethoxyethyl lithocholate, 2-cyclohexyloxyethyl lithocholate, 3-oxocyclo-hexyl lithocholate, tetrahydropyranyl lithocholate, and mevalonolactone lithocholic acid ester.

These alicyclic additives may be used alone or in a mixture of two or more thereof.

The amount of the alicyclic additives to be incorporated is normally not higher than 50 parts by weight, preferably not higher than 30 parts by weight based on 100 parts by weight of the resin (A). In this case, if the amount of the alicyclic additives to be incorporated is above 50 parts by weight, the resist tends to have lower durability to heat.

The radiation sensitive resin composition of the present invention may have a surfactant for improving applicability, developability and the like incorporated.

The aforementioned surfactant includes, for example, nonionic surfactants such as polyoxyethylenelaurylether, polyoxyethylenestearylether, polyoxyethylene-oleylether, polyoxyethylene n-octylphenylether, polyoxy-ethylene n-nonylphenylether, polyoxyethyleneglycoldilaurate, and polyoxyethyleneglycoldistearate as well as other surfactants sold under the following tradenames: KP341 (made by Sinetsu Kagaku Kogyo Co. Ltd.), POLYFLOW Nos. 75 and 95, (made by Kyoei Kagaku Co. Ltd), EFTOP EF301, EF303, EF352 (made by Toukem Products Co. Ltd.), MEGAFAX F171, F173 (made by Dainippon Inki Kagaku Kogyo Co. Ltd.), FROLARD FC430, FC431 (made by Sumitomo 3M Co. Ltd.), ASAHIGARD AG710, SERFRON S-382. SC-101, SC-102, SC-103, SC-104, SC-105, SC-106 (made by Asahi Galass Co. Ltd.).

The amount of the surfactants to be incorporated is normally 2 parts by weight or less based on 100 parts by weight of the total of the resin (A) the acid generator (B).

Additives other than the foregoing include halation inhibitors, adhesive aids, storage stabilizers and anti-foaming agents.

Preparation of a Solution of a Composition

The radiation sensitive resin composition of the present invention is prepared normally by dissolving the components in a solvent to give a solid concentration of 5 to 50% by weight, preferably 10 to 25% by weight in common use, then filtrating the solution through a filter of, for example, a pore size of about 0.2 μm to produce a solution of the composition.

The solvents to be used in the preparation of the solution of the composition include, for example:
linear ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone;
cyclic ketones such as cyclopentanone, 3-methylcyclopentanone, cyclohexanone, 2-methylcyclohexanone, 2,6-dimethylcyclohexanone, and isophorone;
propyleneglycolmonoalkylether acetates such as propyleneglycolmonomethylether acetate, propyleneglycolmonoethylether acetate, propyleneglycolmono-n-propylether acetate, propyleneglycolmono-i-propylether acetate, propyleneglycolmono-n-butylether acetate, propyleneglycolmono-i-butylether acetate, propyleneglycolmono-sec-butyl-ether acetate, and propyleneglycolmono-t-butylether acetate;
alkyl 2-hydroxypropionates such as methyl 2-hydroxypropionate, ethyl 2-hydroxypropinoate, n-propyl 2-hydroxy-propionate, i-propyl 2-hydroxypropionate, n-butyl 2-hydroxy-propionate, i-butyl 2-hydroxypropionate, sec-butyl 2-hydroxypropionate, and t-butyl 2-hydroxypropionate;
alkyl 3-alkoxypropionates such as methyl 3-methoxypropionate, ethyl 3-methoxypropionate, methyl 3-ethoxypropionate, and ethyl 3-ethoxypropionate; as well as
n-propylalcohol, i-propylalcohol, n-butylalcohol, t-butylalcohol, cyclohexanol, ethyleneglycol monomethylether, ethyleneglycol monoethylether, ethyleneglycol mono-n-propyl-ether, ethyleneglycol mono-n-butylether, diethyleneglycol dimethylether, diethyleneglycol diethylether, diethylene-glycol di-n-propylether, diethyleneglycol di-n-butylether, ethyleneglycol monomethylether acetate, ethyleneglycol monoethylether acetate, ethyleneglycol mono-n-propylether acetate, propyleneglycol monomethylether, propyleneglycol monoethylether, propyleneglycol mono-n-propylether, toluene, xylene, ethyl 2-hydroxy-2-methylpropionate, ethyl ethoxy-acetate, ethyl hydroxyacetate, methyl 2-hydroxy-3-methyl-butyrate, 3-methoxybutylacetate, 3-methyl-3-methoxybutyl acetate, 3-methyl-3-methoxybutyl propionate, 3-methyl-3-methoxy butyrate, ethyl acetate, n-propyl acetate, n-butyl acetate, methyl acetoacetate, ethyl acetoacetate, methyl pyruvate, ethyl pyruvate, N-methylpyrrolidone, N,N-dimethyl-formamide, N,N-dimethylacetamide, benzylethylether, di-n-hexylether, diethyleneglycol monomethylether, diethylene-glycol monoethylether, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, and propylene carbonate.

These solvents may be used alone or in a mixture of two or more thereof. Among them linear ketones, cyclic ketones, propyleneglycol monoalkylether acetates, alkyl 2-hydroxypropionates and alkyl 3-alkoxypropionates are preferred.

Process for Forming Resist Pattern

The radiation sensitive resin composition of the present invention is useful as a positive chemically amplifiable type of resist.

The positive chemically amplifiable type of resist dissociates an acid-dissociable organic group in the resin (A) due to the action of the acid released from the acid generator (B) under exposure to produce, for example, a carboxyl group, so that the resin becomes more soluble in an alkaline developer solution in the exposed regions where the resist is dissolved and removed to produce a positive type of resist pattern.

When a resist pattern is to be formed from the radiation sensitive resin composition of the present invention, a solution of the composition is applied on, for example, a substrate like a silicon wafer, an aluminum-coated wafer by any appropriate means such as spin coating, spread coating or roller coating to form a resist film, and optionally effecting pre-heat-treatment (referred to as "PB" hereinafter), then exposing the resist film to form a predetermined resist pattern. The radiations to be used for the exposure may preferably be ArF excimer laser (wavelength: 193 nm) or KrF excimer laser (wavelength: 248 nm).

In the present invention, post-heat-treatment after the exposure (referred to as "PEB" hereinafter) should preferably be conducted. This PEB allows the dissociation reaction of the acid-dissociable organic group in the resin (A) to proceed smoothly. The heat-treatment conditions for PEB may vary depending on the formulation of the radiation sensitive resin composition. However, it is usually in the range of 30 to 200° C., preferably 50 to 170° C.

The present invention may comprise forming an organic or inorganic anti-reflective film on a substrate to be used in order to make use of the maximum of the potential ability of the radiation sensitive resin composition, as disclosed in Japanese Patent Publication No. Hei 6(1994)-12452. and/or forming a protective film on the resist coating in order to avoid the influence of basic impurities and the like contained in ambient atmosphere, as disclosed in Japanese Patent KOKAI No. Hei 5(1993)-188598, or comprise a combination of these techniques.

Then, the exposed resist film is developed to form predetermined pattern.

As the developer solutions to be used for development, for example, aqueous alkaline solutions containing at least one of alkaline compounds such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, ethyldimethylamine, triethanolamine, tetramethylammonium hydroxide, pyrrole, pyperidine, choline, 1,8-diazabicyclo[5.4.0]-7-undecene, and 1,5-diazabicyclo[4.3.0]-5-nonene are preferred.

The concentration of the aqueous alkaline solutions is normally less than 10 parts by weight. In this case, if the concentration of the aqueous alkaline solutions is over 10 parts by weight, there is a fear that non-exposed regions may undesirably be dissolved.

To the aqueous alkaline solutions, for example, an organic solvent may be added.

The organic solvent includes, for example, ketones such as acetone, methylethylketone, methyl-i-butylketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofran, and dioxane; esters such as ethyl acetate, n-butyl acetate, and i-amyl acetate; aromatic hydrocarbons such as toluene, and xylene; phenol, acetonylacetone, and dimethylformamide.

These organic solvents may be used alone or in a mixture of two or more thereof.

The amount of the organic solvents to be used should preferably be not higher than 100% by volume based on the aqueous alkaline solution. In this case, if the amount of the organic solvents to be used is above 100% by volume, the developability is reduced and the residue of development in the exposed regions may possibly be increased.

Moreover, to the developer solution comprising an aqueous alkaline solution, a surfactant and the like may be added in an appropriate amount.

After the development with the developer solution comprising an aqueous alkaline solution, washing with water and drying are generally performed.

The radiation sensitive resin composition of the present invention has an excellent storage stability and the resist produced from the composition has a high transparency to radiations, excellent resolution, high durability to dry etching, high sensitivity as well as the ability of giving an excellent pattern configuration. Therefore, it can advantageously be used for production of semiconductors which will supposedly be more and more micronised in the future.

DESCRIPTION OF PREFERRED EMBODIMENTS

The embodiments of the present invention are described in more detail with reference to examples, to which the present invention is not limited, hereunder. Parts and percentages as used here are by weight, unless otherwise indicated.

Each measurement and evaluation in Examples and Comparative Examples were effected as follows: Mw:

Gel permeation chromatography analysis with GPC columns (two of G2000HHXL, one of G3000HXL, and one of G4000HXL made by TOHSO Co. Ltd.) were effected under the conditions; flow rate: 1.0 mL/min.; eluting solvent: teteahydrofuran; column temperature: 40° C.; and monodispersed polystyrene standard.

Storage Stability

A solution of the composition was applied on a silicon wafer by spin coating, subjected to PB on a hot plate maintained at 140° C. for 90 seconds to form a resist film of 1 μm. The resist film was developed with an aqueous solution of 2.38% teteamethylammonium hydroxide for one minute at 25° C., washed with water, dried, and then the film thickness was measured. This film thickness is referred to as an initial film thickness.

Moreover, the solution of the composition was maintained on a thermostat at 50° C. This solution of the composition was used for repeating the procedure as above, i.e., the forming of resist film, development, washing with water, drying, and the measurement of film thickness. The resulting film thickness is referred to as the film thickness after the retention.

The longest period of time by days required to achieve a film thickness after the retention which is over 50% relative to the initial film thickness. The longer the number of retention days, the better the storage stability.

Radiation Transmittance

A solution of the composition was applied on a sheet of quartz glass by spin coating, subjected to PB on a hot plate maintained at 90° C. for 60 seconds to form a resist film of a thickness of 1 μm. The resist film was evaluated for the radiation transmittance by calculation with the absorbance at a wavelength of 193 μm which was used as a measure of transparency in the far ultraviolet radiation range.

Relative Etching Velocity

The solution of the composition was applied by spin coating on a silicon wafer, dried to form a resist film of a thickness of 0.5 μm which was dry etched with the dry etching apparatus, Pinnacle 8000, made by PMT Co. using an etching gas of $CF_4$ at a gas flow rate of 75 sccm under a pressure of 2.5 mTorr and an output of 2,500 W, and the etching velocity was measured. From the value of the he etching velocity relative to that of a film of cresol novolak resin, a relative etching velocity was determined. The lower the relative etching velocity, the better the durability to dry etching.

Sensitivity

For substrates, silicon wafers having a film of Deep UV30 (made of Brewer Science Limited.) of a thickness of 520 Å formed on the surface (ARC) (Examples 1 to 3, Examples 5 to 9 and Comparative Example 1) and silicon wafers having a silicon oxynitride (SiON) film formed on the surface for exhibiting anti-reflective effect at a wavelength of 193 nm (Example 4) were used. A solution of the composition was applied by spin coating on each of substrate, subjected to PB on a hot plate under the conditions indicated in Table 2 to produce a resist film of a thickness of 0.4 μm (Examples 1 to 5, Examples 8 to 9 and Comparative Example 1) or 0.2 μm (Examples 6 to 7) which was exposed to a radiation through a patterned mask with ArF excimer laser irradiation apparatus (made by Nicon Corporation, Lens aperture: 0.55; Radiation wavelength: 193 nm), then subjected to PEB under the conditions indicated in Table 2, developed for one minute at 25° C. using an aqueous solution of 2.38% tetramethylammonium hydroxide (Examples 1 to 9) or an aqueous solution of 2.38×1/50% tetramethylammonium hydroxide (Comparative Example 1), washed with water, and dried to from a resist pattern of a positive type. A dose for forming a line width at a rate of 1:1 using a line & space pattern (1L1S) of a width of 0.18 μm was evaluated as optimum exposure which was used as sensitivity.

Resolution

The dimension of the minium resist pattern capable of being resolved with the optimum exposure was determined as resolution.

Scanning electron microscope examination was used to evaluate an extent of scum and residue after the development.

Pattern Configuration

A square of the line & space pattern of a line width of 0.20 μm was measured with the scanning electron microscope for the upper side dimension $L^1$ and the bottom side dimension $L_2$. When the condition $0.85 \leq L_2/L_1 \leq 1$ is satisfied and the pattern form is not flared, the pattern configuration is referred to as "good", while when at least one of these conditions are not satisfied, it is referred to as "failure".

SYNTHESIS EXAMPLE 1

104.1 grams of 8-t-butoxyarbonyltetracyclo [$4.4.0.1^{2.5}.1^{7.10}$]dodec-3-ene, 39.2 grams of maleic anhydride, 39.6 grams of the compounds represented by the formula (4-4) as above, 15 grams of azobisisobutyronitrile, 74 grams of n-butyl acetate were charged in a flask and polymerized at 70° C. for 6 hours. After the end of polymerization, the reaction solution was-cooled to room temperature, poured into a great deal of i-propylalcohol, and the precipitated resin was filtered, washed with a little amount of i-propylalcohol, and dried under vacuum to yield a white resin having a Mw of 17,000.

The resin was a copolymer having the recurring units (7-1), (7-2), and (7-3) shown in the following formula (7) in an amount of 40 molar %, 40 molar %, and 20 molar %, respectively. This resin is referred to as: "resin (A-1)".

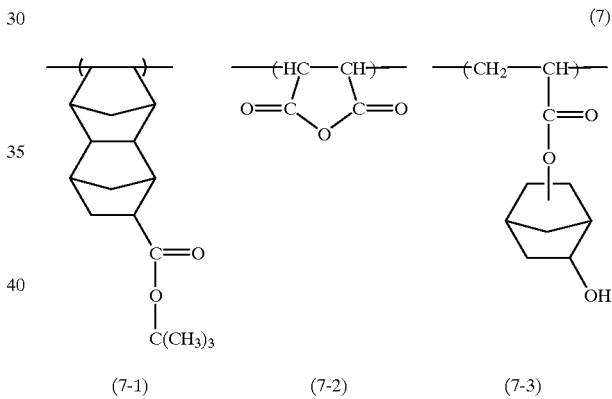

(7)

(7-1)        (7-2)        (7-3)

SYNTHESIS EXAMPLE 2

The procedure of Synthesis example 1 was repeated, except that as starting materials, 77.7 grams of 5-t-butoxycarbonylbicyclo[2.2.1]hept-2-ene, 39.2 grams of maleic anhydride, 52.8 grams of the compound represented by the formula (4-2) as above, 15 grams of azobisisobutyronitrile, 255 grams of n-butyl acetate were used to yield a white resin having a Mw of 25,000.

This resin was a copolymer having the recurring units (8-1), (8-2), and (8-3) shown in the following formula (8) in an amount of 40 molar %, 40 molar %, and 20 molar %, respectively. This resin is referred to as "resin (A-2)".

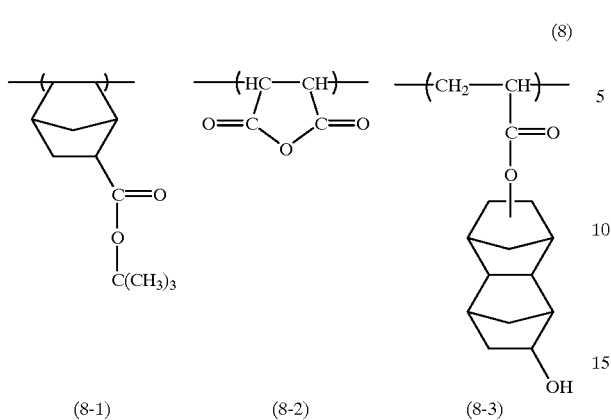

(8)

(8-1)  (8-2)  (8-3)

SYNTHESIS EXAMPLE 3

The procedure of Synthesis example 1 was repeated, except that as starting materials, 99.1 grams of 5-t-butoxycarbonylbicyclo[2.2.1]hept-2-ene, 36.8 grams of maleic anhydride, 53 grams of the compound represented by the formula (4-5) as above, 12.7 grams of 2,5-dimethyl-2,5-hexanedioldiacrylate, 15 grams of azobisisobutyronitrile, 300 grams of n-butyl acetate were used to yield a white resin having a Mw of 47,000.

This resin was a copolymer having the recurring units (9-1), (9-2), (9-3) and (9-4) shown in the formula (9) in an amount of 44 molar %, 37 molar %, 15 molar % and 4 molar %, respectively. This resin is referred to as "resin (A-3)".

(9)

(9-1)  (9-2)  (9-3)

-continued (9-4)

SYNTHESIS EXAMPLE 4

The procedure of Synthesis example 1 was repeated, except that as starting materials, 77.7 grams of 5-t-butoxycarbonylbicyclo[2.2.1]hept-2-ene, 39.2 grams of maleic anhydride, 47.2 grams of the compound represented by the formula (4-14) as above, 15.2 grams of tricyclodecanyl dimethylol diacrylate, 15 grams of azobisisobutyronitrile, 270 grams of n-butyl acetate were used to yield a white resin having a Mw of 35,000.

This resin was a copolymer having the recurring units (10-1), (10-2), (10-3) and (10-4) shown in the following formula (10) in an amount of 38 molar %, 38 molar %, 20 molar % and 4 molar %, respectively. This resin is referred to as "resin (A-4)".

(10)

(10-1)  (10-2)  (10-3)

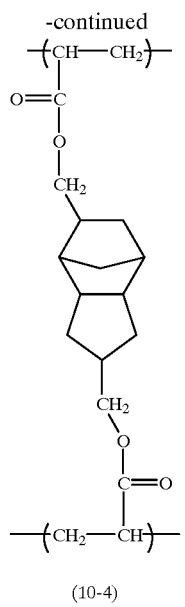

(10-4)

SYNTHESIS EXAMPLE 5

The procedure of Synthesis example 1 was repeated, except that as starting materials, 66 grams of 5-t-butoxycarbonylbicyclo[2.2.1]hept-2-ene, 41.7 grams of maleic anhydride, 35.1 grams of the compound represented by the formula (5-14) as above, 16.2 grams of 8-hydroxymethyltetracyclo[4.4.0.1$^{2,5}$.1$^{7,10}$]dodec-3-ene, 15 grams of dimethyl-2,2'-azobisisobutyrate, 240 grams of n-butyl acetate were used to yield a white resin having a Mw of 18,000.

This resin was a copolymer having the recurring units (11-1), (11-2), (11-3) and (11-4) shown in the following formula (11) in an amount of 33 molar %, 42 molar %, 15 molar % and 10 molar %, respectively. This resin is referred to as "resin (A-5)".

(11)

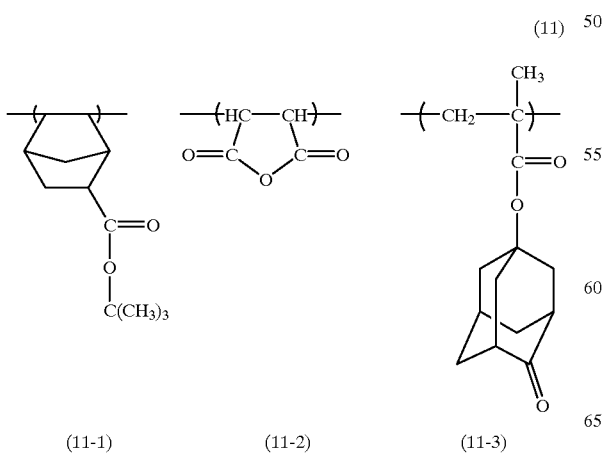

(11-1)            (11-2)            (11-3)

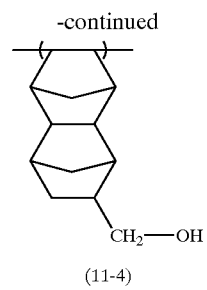

(11-4)

SYNTHESIS EXAMPLE 6

The procedure of Synthesis example 1 was repeated, except that as starting materials, 5.2 grams of bicyclo[2.2.1]hept-2-ene-5,6-carboxylic anhydride, 43.0 grams of 5-t-butoxycarbonylbicyclo[2.2.1]hept-2-ene, 25.0 grams of maleic anhydride, 28.0 grams of the compound represented by the formula (4-7) as above, 5 grams of azobisisobutyronitrile, 100 grams of tetrahydrofuran were used too yield a white resin having a Mw of 12,000.

This resin was a copolymer having the recurring units (12-1), (12-2), (12-3), and (12-4) shown in the following formula (12) in an amount of 5 molar %, 36 molar %, 41 molar %, and 18 molar %, respectively. This resin is referred to as "resin (A-6)".

(12)

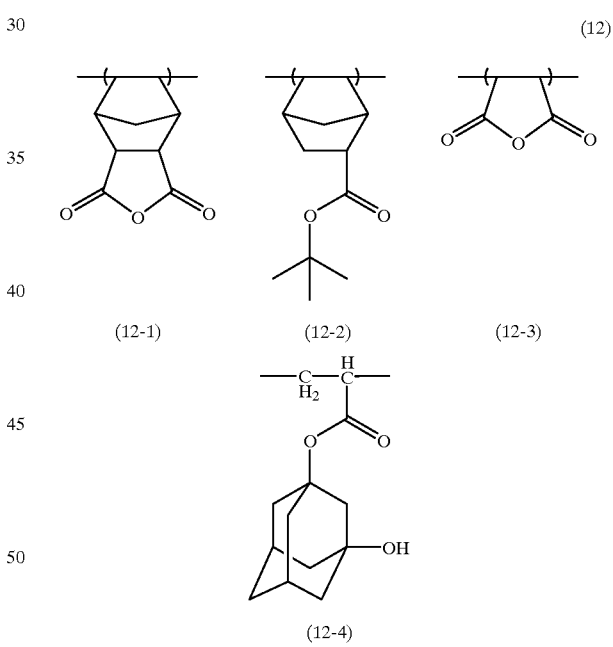

(12-1)            (12-2)            (12-3)

(12-4)

SYNTHESIS EXAMPLE 7

The procedure of Synthesis example 1 was repeated, except that as starting materials, 7.0 grams of bicyclo[2.2.1]hept-2-ene-5.6(3H)-furanone, 44.0 grams of 5-t-butoxycarbonylbicyclo[2.2.1]hept-2-ene, 27.0 grams of maleic anhydride, 23.0 grams of the compound represented by the formula (4.7) as above, 5 grams of azobisisobutyronitrile, 100 grams of tetrahydrofuran were used to yield a white resin having a Mw of 10,000.

This resin was a copolymer having the recurring units (13-1), (13-2), (13-3), and (13-4) shown in the following formula (13) in an amount of 7 molar %, 35 molar %, 42 molar %, and 16 molar %, respectively. This resin is referred to as "resin (A-7)".

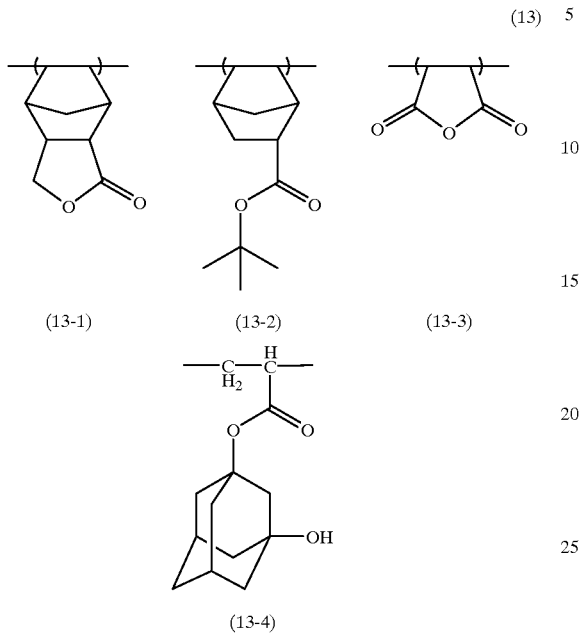

(13-1)   (13-2)   (13-3)

(13-4)

SYNTHESIS EXAMPLE 8

The procedure of Synthesis example 1 was repeated, except that as starting materials, 8.0 grams of bicyclo[2.2.1]hept-2-ene-5,6-(3,8-dimethyl)furanone, 43.0 grams of 5-t-butoxycarbonylbicyclo[2.2.1]hept-2-ene, 26.0 grams of maleic anhydride, 23.0 grams of the compound represented by the formula (4-7) as above, 5 grams of azobisisobutyronitrile, 100 grams of tetrahydrofuran were used to yield a white resin having a Mw of 9,000.

This resin was a copolymer having the recurring units (14-1), (14-2), (14-3), and (14-4) shown in the following formula (14) in an amount of 7 molar %, 35 molar %, 42 molar %, and 16 molar %, respectively. This resin is referred to as "resin (A-8)".

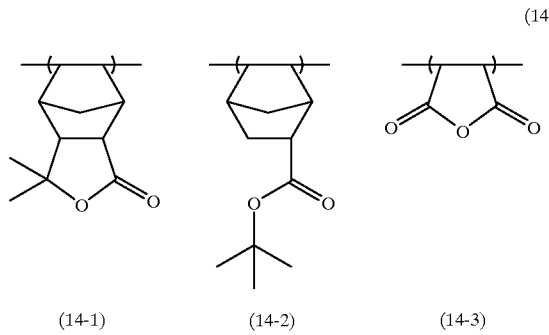

(14-1)   (14-2)   (14-3)

-continued

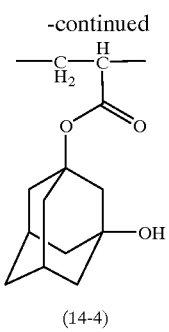

(14-4)

SYNTHESIS EXAMPLE 9

The procedure of Synthesis example 1 was repeated, except that as starting materials, 48.0 grams of 5-t-butoxycarbonylbicyclo[2.2.1]hept-2-ene, 24.0 grams of maleic anhydride, 28.0 grams of the compound represented by the formula (4-8) as above, 5 grams of azobisisobutyronitrile, 100 grams of tetrahydrofuran were used to yield a white resin having a Mw of 8,8000.

This resin was a copolymer having the recurring units (15-1), (15-2), and (15-3) shown in the following formula (15) in an amount of 40 molar %, 40 molar %, and 20 molar %, respectively. This resin is referred to as "resin (A-9)".

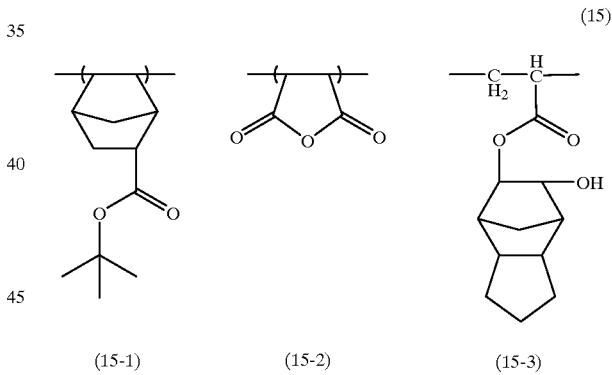

(15-1)   (15-2)   (15-3)

SYNTHESIS EXAMPLE 10

The procedure of Synthesis example 1 was repeated, except that as starting materials, 47.0 grams of 5-t-butoxycarbonylbicyclo[2.2.1]hept-2-ene, 19.0 grams of maleic anhydride, 44.0 grams of the compound represented by the formula (4-7) as above, 5 grams of azobisisobutyronitrile, 100 grams of tetrahydrofuran were used to yield a white resin having a Mw of 9,000.

This resin was a copolymer having the recurring units (16-1), (16-2), and (16-3) shown in the following formula (16) in an amount of 35 molar %, 35 molar %, and 30 molar %, respectively. This resin is referred to as "resin (A-10)".

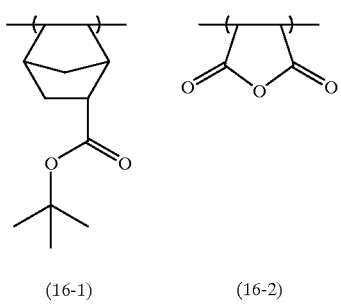

(16)

(16-1)    (16-2)    (16-3)

SYNTHESIS EXAMPLE 11

The procedure of Synthesis example 1 was repeated, except that as starting materials, 5.0 grams of 2-carboxybicyclo[2.2.1]hept-2-ene-2-yl-acetic anhydride, 43.0 grams of 5-t-butoxycarbonylbicyclo[2.2.1]hept-2-ene, 26.0 grams of maleic anhydride, 23.0 grams of the compound represented by the formula (4-7) as above, 5 grams of azobisisobutyronitrile, 100 grams of tetrahydrofuran were used to yield a white resin having a Mw of 9,000.

This resin was a copolymer having the recurring units (17-1), (17-2), (17-3), and (17-4) shown in the following formula (17) in an amount of 7 molar %, 35 molar %, 42 molar %, and 16 molar %, respectively. This resin is referred to as "resin (A-11)".

(17)

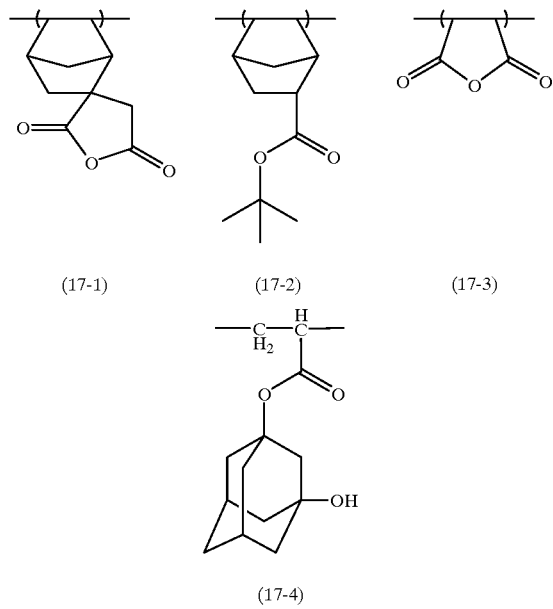

(17-1)    (17-2)    (17-3)

(17-4)

EXAMPLES 1 TO 15 AND COMPARATIVE EXAMPLE 1

The solution of each of the compositions containing the components shown in Table 1 was evaluated for various performances. The results of the evaluation is shown in Table 3.

Components other than the resins (A-1) to (A-11) are as follows:

Other Resins a-1: t-butyl methacrylate/methyl methacrylate/methacrylic acid copolymer (copolymerization ratio=40/40/20, Mw=20,000).

Acid Generators (B)

B-1: triphenylsulfonium trifloromethanesulfonate
B-2: triphenylsulfonium nonafloro-n-butanesulfonate
B-3: 4-n-butoxy-1-naphthyltetrahydrothiophenium nonafloro-n-butanesulfonate
B-4: bis(4-t-butylphenyl)iodonium nonafloro-n-butanesulfonate
B-5: trifloromethanesulfonylbicyclo[2.2.1]hept-5-ene-2,3-dicarbodiimide Acid Diffusion Controlling Agents C-1: tri-n-octylamine
C-2: dicyclohexylmethylamine
C-3: 1-(2'-hydroxyethyl)piperazine
C-4: 4-hydroxyquinoline Other Additives D-1: t-butyl deoxycholate (see, the following formula (12))

(12)

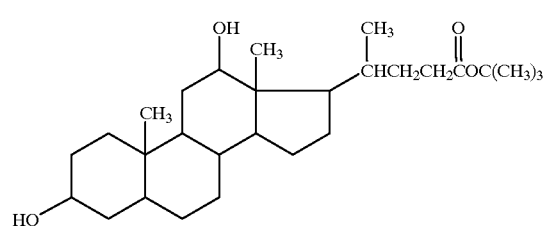

D-2: di-t-butyl 1,3-adamantanedicarboxylate

Solvents

E-1: 2-heptane
E-2: ethyl 2-hydroxypropionate
E-3: propyleneglycol monoethylether acetate
E-4: ethyl 3-ethoxypropionate

TABLE 1

| | Resin (parts) | Acid Generator (parts) | Acid diffusion controlling agent (parts) | Other additive (parts) | Solvent (parts) |
|---|---|---|---|---|---|
| Example 1 | A-1(100) | B-1(1.5) | C-1(0.03) | — | E-1(480) |
| Example 2 | A-1(90) | B-2(1.5) | C-2(0.03) | D-1(10) | E-2(480) |
| Example 3 | A-2(100) | B-2(1.5) | C-3(0.03) | — | E-3(530) |
| Example 4 | A-2(95) | B-3(2.0) | C-4(0.03) | D-1(5) | E-2(430) E-4(100) |
| Example 5 | A-3(90) | B-4(1.5) | C-1(0.03) | D-1(10) | E-1(530) |
| Example 6 | A-4(90) | B-1(1.5) B-5(0.3) | C-1(0.03) | D-1(10) | E-1(530) |
| Example 7 | A-4(90) | B-2(1.5) B-5(0.3) | C-1(0.03) | D-2(10) | E-1(530) |
| Example 8 | A-5(90) | B-2(1.5) | C-1(0.03) | D-2(10) | E-1(370) E-3(160) |
| Example 9 | A-5(85) | B-2(1.5) | C-1(0.03) | D-1(15) | E-3(530) |
| Example 10 | A-6(100) | B-1(2.0) | C-2(0.03) | — | E-1(480) |
| Example 11 | A-7(95) | B-1(2.0) | C-2(0.03) | D-1(5) | E-3(480) |
| Example 12 | A-8(100) | B-1(2.0) | C-1(0.03) | — | E-1(480) |
| Example 13 | A-9(100) | B-1(2.0) | C-1(0.03) | — | E-1(480) |
| Example 14 | A-10(95) | B-1(2.0) | C-2(0.03) | D-1(5) | E-1(480) |
| Example 15 | A-11(100) | B-1(2.0) | C-2(0.03) | — | E-3(480) |
| Comp. Ex. 1 | a-1(100) | B-1(1.5) | C-1(0.03) | — | E-1(530) |

TABLE 2

|  | Thickness of resist film (μm) | Substrate | PB Temperature (°C.) | PB Time (Sec.) | PEB Temperature (°C.) | PEB Time (Sec.) |
|---|---|---|---|---|---|---|
| Example 1 | 0.4 | ARC | 130 | 90 | 140 | 60 |
| Example 2 | 0.4 | ARC | 130 | 90 | 140 | 60 |
| Example 3 | 0.4 | ARC | 140 | 90 | 140 | 60 |
| Example 4 | 0.4 | SiON | 130 | 90 | 140 | 60 |
| Example 5 | 0.4 | ARC | 130 | 90 | 130 | 60 |
| Example 6 | 0.2 | ARC | 130 | 90 | 130 | 60 |
| Example 7 | 0.2 | ARC | 130 | 90 | 130 | 60 |
| Example 8 | 0.4 | ARC | 130 | 90 | 140 | 60 |
| Example 9 | 0.4 | ARC | 130 | 90 | 140 | 60 |
| Example 10 | 0.34 | SiON | 130 | 90 | 130 | 90 |
| Example 11 | 0.34 | SiON | 130 | 90 | 130 | 90 |
| Example 12 | 0.34 | ARC | 130 | 90 | 130 | 90 |
| Example 13 | 0.34 | ARC | 130 | 90 | 130 | 90 |
| Example 14 | 0.28 | SiON | 130 | 90 | 130 | 90 |
| Example 15 | 0.34 | ARC | 130 | 90 | 130 | 90 |
| Comp. Ex. 1 | 0.4 | ARC | 130 | 90 | 140 | 60 |

TABLE 3

|  | Storage stability (days) | Radiation transmittance (193 nm, %) | Relative etching rate | Sensitivity (mJ/cm$^2$) | Resolution (μm) | Pattern configuration |
|---|---|---|---|---|---|---|
| Example 1 | 60 days or more | 67 | 1.5 | 12 | 0.15 | good |
| Example 2 | 60 days or more | 65 | 1.4 | 13 | 0.15 | good |
| Example 3 | 60 days or more | 64 | 1.6 | 11 | 0.15 | good |
| Example 4 | 60 days or more | 68 | 1.4 | 10 | 0.15 | good |
| Example 5 | 60 days or more | 66 | 1.5 | 9 | 0.15 | good |
| Example 6 | 60 days or more | 69 | 1.4 | 8 | 0.15 | good |
| Example 7 | 60 days or more | 72 | 1.6 | 14 | 0.15 | good |
| Example 8 | 60 days or more | 73 | 1.5 | 13 | 0.15 | good |
| Example 9 | 60 days or more | 71 | 1.4 | 11 | 0.15 | good |
| Example 10 | 60 days or more | 70 | 1.3 | 12 | 0.15 | good |
| Example 11 | 60 days or more | 72 | 1.3 | 12 | 0.15 | good |
| Example 12 | 60 days or more | 66 | 1.4 | 13 | 0.15 | good |
| Example 13 | 60 days or more | 68 | 1.3 | 14 | 0.15 | good |
| Example 14 | 60 days or more | 73 | 1.4 | 15 | 0.15 | good |
| Example 15 | 60 days or more | 74 | 1.4 | 11 | 0.15 | good |
| Comp. Ex. 1 | 10 days | 71 | 2.5 | 13 | 0.25 | failure |

What is claimed is:

1. A radiation sensitive resin composition comprising (A) a resin containing an alkaline insoluble or less soluble group which is dissociable with acid, said resin being soluble in an alkaline solution when said group is dissociated, and being a copolymer containing a recurring unit (I), a recurring unit (II) and a recurring unit (III-1) represented by the formula (1):

(1)

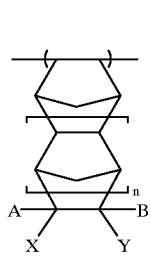
(I)

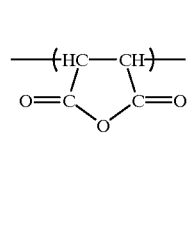
(II)

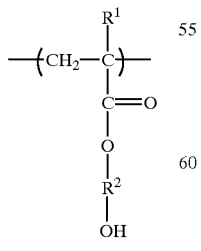
(III-1)

wherein A and B represent independently a hydrogen atom, or an organic group having 20 or less carbon atoms which can be dissociated in the presence of acid to produce an acidic functional group, at least one of A and B being said acid-dissociable organic group; X and Y represent independently a hydrogen atom or an alkyl group having 1 to 4 carbon atoms; n is an integer of 0 to 3; $R^1$ represents a hydrogen atom, a methyl or methylol group; $R^2$ represents a divalent hydrocarbon group having an alicyclic group and having 3 to 15 carbon atoms; and (B) a radiation sensitive acid-generator, wherein a monomer capable of giving the recurring unit (III-1) is at least one (meth)acrylic acid derivative selected from the group consisting of those represented by the formulae (4-1) to (4-24):

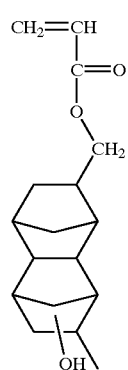
(4-1)

-continued
(4-2)
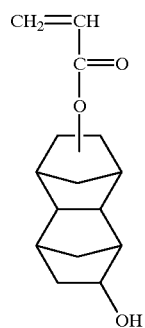
(4-3)
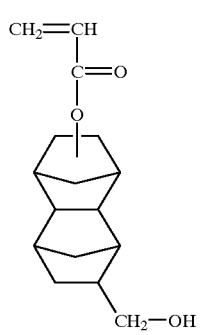
(4-4)
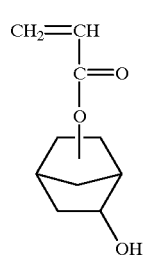
(4-5)
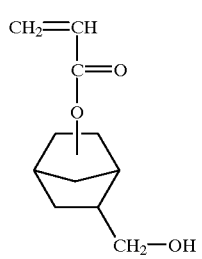
(4-6)
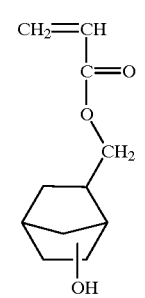
-continued
(4-7)
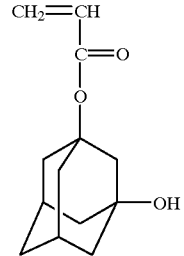
(4-8)
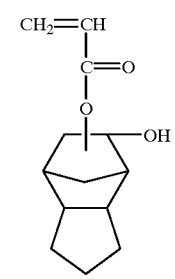
(4-9)
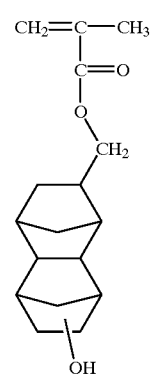
(4-10)
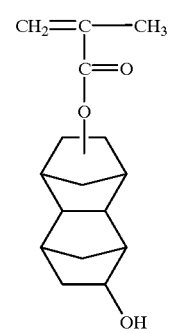
(4-11)
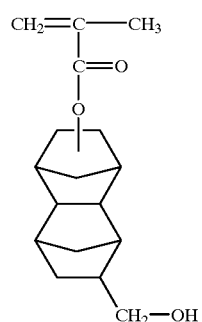

(4-12)
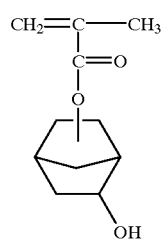
(4-13)
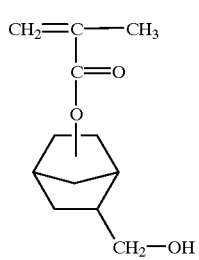
(4-14)
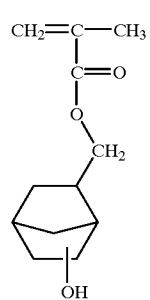
(4-15)
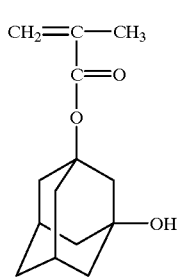
(4-16)
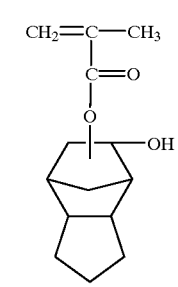
(4-17)
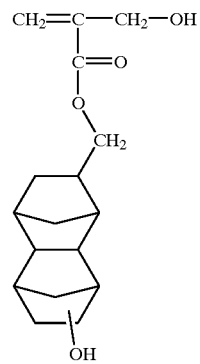
(4-18)
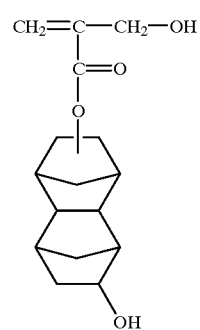
(4-19)
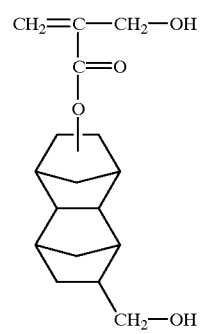
(4-20)
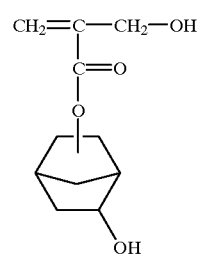
(4-21)
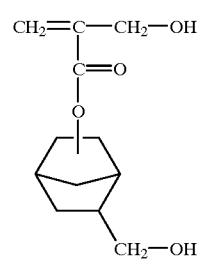

(4-22)

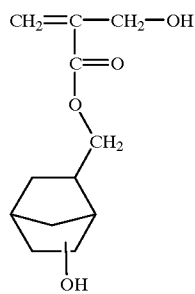

(4-23)

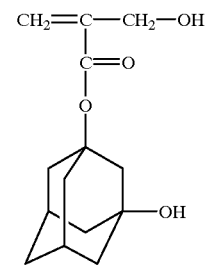

(4-24)

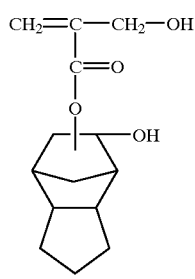

2. The radiation sensitive resin composition according to claim 1, wherein said acid-dissociable organic group of the recurring unit (I) is equivalent to a group —COOR' where R' is a (cyclo)alkyl group having 1 to 19 carbon atoms, or a group —COOCH$_2$COOR" where R" is a (cyclo)alkoxycarbonylmethyl group having 1 to 17 carbon atoms.

3. The radiation sensitive resin composition according to claim 1, wherein said acid-dissociable organic group of the recurring unit (I) is at least one member selected from the group consisting of 1-methylpropoxycarbonyl, t-butoxycarbonyl, t-butoxycarbonylmethoxycarbonyl.

4. The radiation sensitive resin composition according to claim 1, wherein said n of the recurring unit (I) is 0 or 1.

5. The radiation sensitive resin composition according to claim 1, wherein a monomer capable of giving the recurring unit (I) is at least one selected from the group consisting of 5-t-butoxycarbonylbicyclo[2.2.1]hept-2-ene, 5,6-di(t-butoxycarbonyl)bicyclo[2.2.1]hept-2-ene, 5,6-di(t-butoxycarbonylmethoxycarbonyl)bicyclo[2.2.1]hept-2-ene, 8-t-butoxycarbonyltetracyclo[4.4.0.1$^{2.5}$.1$^{7.10}$]dodec-3-ene, 8-methyl-8-t-butoxycarbonyltetracyclo[4.4.0.1$^{2.5}$1$^{7.10}$]dodec-3-ene, and 8-methyl-8-t-butoxycarbonylmethoxycarbonyltetracyclo[4.4.0.1$^{2.5}$.1$^{7.10}$]dodec-3-ene.

6. The radiation sensitive resin composition according to claim 1, wherein said (meth)acrylic acid derivative is a compound represented by the general formula (4-2), (4-4), (4-5), or (4-14).

7. The radiation sensitive resin composition according to claim 1, wherein said component (A) is a resin further having at least one additional recurring unit selected from the group consisting of norbornene, recurring units produced from the cleavage of polymerizable carbon-carbon double bonds of norbornene derivatives containing no acid-dissociable organic group and recurring units produced from the cleavage of polymerizable carbon-carbon double bonds of other compounds having such carbon-carbon double bond.

8. The radiation sensitive resin composition according to claim 7, wherein said copolymer (1) has a content of the total of the recurring unit (I) and any additional recurring unit derived from norbornene and other norbornene derivatives (α) of 20 to 95 molar % based on the whole recurring units, and a content of the recurring unit (II) of 5 to 85 molar % based on the whole recurring units, and a content of the recurring unit (II-1) of 5 to 75 molar % based on the whole recurring units, and a content of the recurring units produced from the cleavage of the polymerizable carbon-carbon double bonds of other compounds having such carbon-carbon double bonds of 10 molar % or less based on the whole recurring units.

9. The radiation sensitive resin composition according to claim 1, wherein said copolymer has a weight average molecular weight measured as polystyrene of 3,000 to 300,000 as determined by gel permeation chromatography (GPC).

10. The radiation sensitive resin composition according to claim 1, wherein said acid generator (B) is at least one selected from the group consisting of onium salt, halogen containing compounds, diazoketone compounds, sulfone compounds, and sulfonic acid compounds.

11. The radiation sensitive resin composition according to claim 1, wherein the amount of said acid generators (B) to be used is 1.0 to 10 parts by weight based on 100 parts by weight of the resin (A).

12. The radiation sensitive resin composition according to claim 1, wherein it contains further an acid diffusion controlling agent.

13. The radiation sensitive resin composition according to claim 12, wherein said acid diffusion controlling agent is a nitrogen-containing organic group.

14. The radiation sensitive resin composition according to claim 1, wherein it contains further an alicyclic additive having an acid-dissociable organic group.

15. The radiation sensitive resin composition according to claim 14, wherein said alicyclic additive is at least one member selected from the group consisting of adamantane derivatives, deoxycholic acid esters, and lithocholic acid esters.

16. The radiation sensitive resin composition according to claim 1, wherein said radiation sensitive resin composition is dissolved in a solvent, and said solvent is at least one selected from the group consisting of linear ketones, cyclic ketones, propyleneglycol monoalkylether acetates, alkyl 2-hydroxypropionates and alkyl 3-alkoxypropionates.

17. A radiation sensitive resin composition comprising (A) a resin containing an alkaline insoluble or less soluble group which is dissociable with acid, said resin being soluble in an alkaline solution when said group is dissociated, and being a copolymer containing a recurring unit (I), a recurring unit (II) and a recurring unit (III-2) represented by the formula (2):

(2)

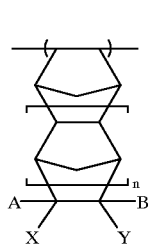 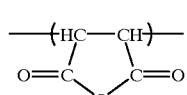 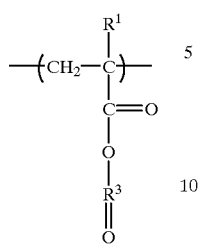

(I)　　　　　(II)　　　　　(III-2)

wherein A and B represent independently a hydrogen atom, or an organic group having 20 or less carbon atoms which can be dissociated in the presence of acid to produce an acidic functional group, at least one of A and B being said acid-dissociable organic group; X and Y represent independently a hydrogen atom or an alkyl group having 1 to 4 carbon atoms; n is an integer of 0 to 3; $R^1$ represents a hydrogen atom, a methyl or methylol group; 15 carbon atoms; and $R^3$ represents a trivalent hydrocarbon group having an alicyclic group and having 3 to 15 carbon atoms, and (B) a radiation sensitive acid-generator,
  wherein a monomer capable of giving the recurring unit (III-2) is at least one (meth)acrylic acid derivative selected from the group consisting of those represented by the formulae (5-1) to (5-21):

(5-1)

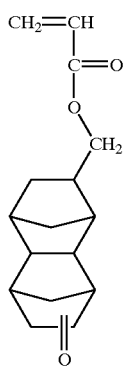

(5-2)

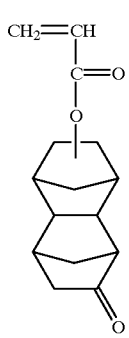

(5-3)

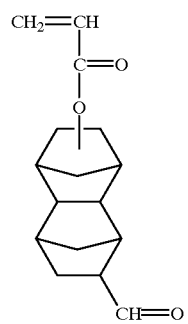

(5-4)

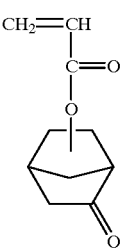

(5-5)

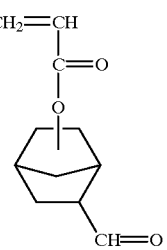

(5-6)

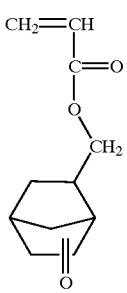

(5-7)

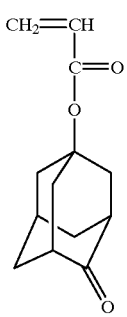

(5-8) 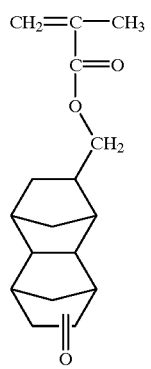
(5-9) 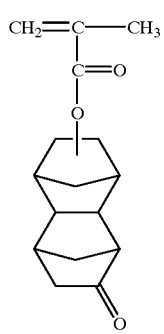
(5-10) 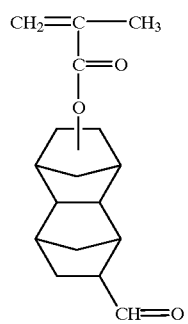
(5-11) 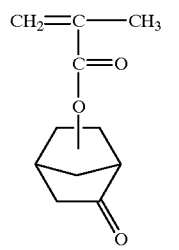
(5-12) 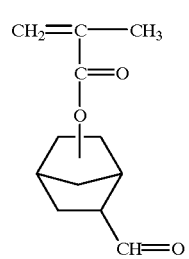
(5-13) 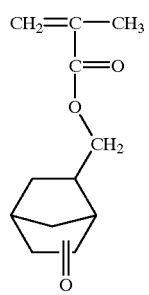
(5-14) 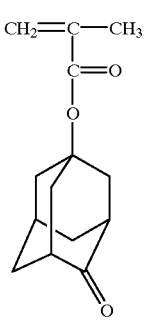
(5-15) 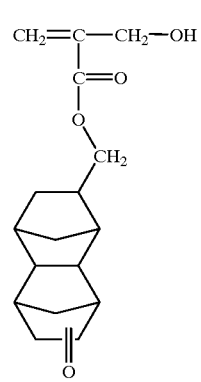
(5-16) 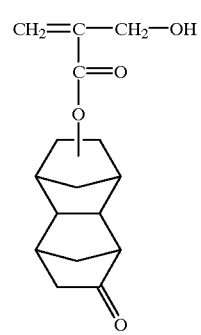

-continued (5-17) 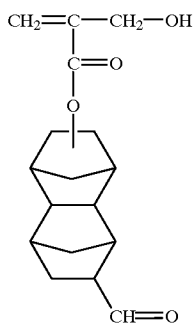

(5-18) 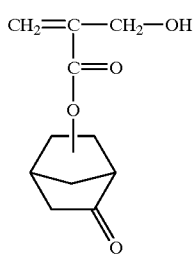

(5-19) 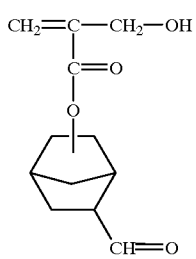

(5-20) 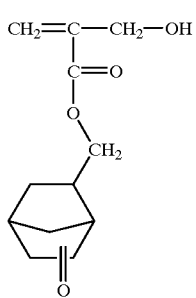

(5-21) 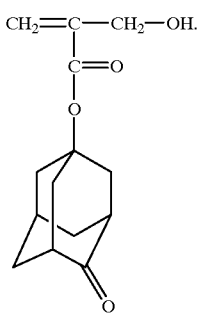

18. The radiation sensitive resin composition according to claim 1, wherein said (meth)acrylic acid derivative is a compound represented by the general formula (5-2), (5-4), (5-5), or (5-14).

19. The composition according to claim 17, wherein said acid-dissociable organic group of the recurring unit (I) is at least one member selected from the group consisting of 1-methylpropoxycarbonyl, t-butoxycarbonyl, and t-butoxycarbonylmethoxycarbonyl.

20. The composition according to claim 17, wherein a monomer capable of giving the recurring unit (I) is at least one member selected from the group consisting of 5-t-butoxy-carbonylbicyclo[2.2.1]hept-2-ene, 5,6-di(t-butoxycarbonyl)-bicyclo[2.2.1]hept-2-ene, 5,6-di(t-butoxycarbonylmethoxycarbonyl)bicyclo[2.2.1]hept-2-ene, 8-t-butoxycarbonyltetracyclo[4.4.0.1$^{2.5}$.1$^{7.10}$]dodec-3-ene, 8-methyl-8-t-butoxy-carbonyltetracyclo[4.4.0.1$^{2.5}$.1$^{7.10}$]dodec-3-ene, and 8-methyl-8-t-butoxycarbonylmethoxycarbonyltetracyclo[4.4.0.1$^{2.5}$.1$^{7.10}$]dodec-3-ene.

21. The composition according to claim 17, wherein it contains an alicyclic additive having an acid-dissociable organic group, said alicyclic additive being at least one member selected from the group consisting of adamantane derivatives, deoxychlolic acid esters, and lithocholic acid esters.

22. The composition according to claim 17, wherein said component (A) is a resin having at least one recurring unit selected from the group consisting of norbornene, recurring units produced from the cleavage of polymerizable carbon-carbon double bonds of norbornene derivatives containing no acid-dissociable organic group and recurring units produced from the cleavage of polymerizable carbon-carbon double bonds of other compounds having such carbon-carbon double bond.

23. The composition according to claim 22, wherein said copolymer (2) has a content of the total of the recurring unit (I) and the recurring unit derived from norbornene and other norbornene derivative ($\alpha$) of 20 to 95 molar % based on the whole recurring units, and a content of the recurring unit (II) of 5 to 85 molar % based on the whole recurring units, and a content of the recurring unit (III-2) of 5 to 75 molar % based on the whole recurring units, and a content of the recurring units produced from the cleavage of the polymerizable carbon-carbon double bonds of other compounds having such carbon-carbon double bonds of 10 molar % or less based on the whole recurring units.

* * * * *